(12) United States Patent
Drowley et al.

(10) Patent No.: US 12,125,914 B2
(45) Date of Patent: *Oct. 22, 2024

(54) METHOD AND SYSTEM FOR FABRICATION OF A VERTICAL FIN-BASED FIELD EFFECT TRANSISTOR

(71) Applicant: SEMICONDUCTOR COMPONENTS INDUSTRIES, LLC, Scottsdale, AZ (US)

(72) Inventors: Clifford Drowley, Santa Clara, CA (US); Ray Milano, Santa Clara, CA (US); Subhash Srinivas Pidaparthi, Santa Clara, CA (US); Andrew P. Edwards, Santa Clara, CA (US); Hao Cui, Santa Clara, CA (US); Shahin Sharifzadeh, Santa Clara, CA (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/213,781

(22) Filed: Jun. 23, 2023

(65) Prior Publication Data
US 2023/0411525 A1 Dec. 21, 2023

Related U.S. Application Data

(60) Continuation of application No. 17/719,221, filed on Apr. 12, 2022, now Pat. No. 11,735,671, which is a
(Continued)

(51) Int. Cl.
*H01L 29/78* (2006.01)
*H01L 29/66* (2006.01)
*H01L 29/778* (2006.01)

(52) U.S. Cl.
CPC ...... *H01L 29/7856* (2013.01); *H01L 29/6653* (2013.01); *H01L 29/66803* (2013.01); *H01L 29/7783* (2013.01); *H01L 29/7788* (2013.01)

(58) Field of Classification Search
CPC . H01L 29/0653; H01L 29/32; H01L 29/2003; H01L 29/66462; H01L 29/66522;
(Continued)

(56) References Cited

U.S. PATENT DOCUMENTS 6,211,063 B1 4/2001 Liu et al.
6,917,054 B2 * 7/2005 Onose ................. H01L 29/7722
257/77

(Continued)

OTHER PUBLICATIONS

U.S. Appl. No. 16/929,926, "Non-Final Office Action", Jun. 15, 2021, 14 pages.
(Continued)

*Primary Examiner* — Natalia A Gondarenko
(74) *Attorney, Agent, or Firm* — Kevin B. Jackson

(57) ABSTRACT

A method of fabricating a vertical fin-based field effect transistor (FET) includes providing a semiconductor substrate having a first surface and a second surface, the semiconductor substrate having a first conductivity type, epitaxially growing a first semiconductor layer on the first surface of the semiconductor substrate, the first semiconductor layer having the first conductivity type and including a drift layer and a graded doping layer on the drift layer, and epitaxially growing a second semiconductor layer having the first conductivity type on the graded doping layer. The method also includes forming a metal compound layer on the second semiconductor layer, forming a patterned hard mask layer on the metal compound layer, and etching the metal compound layer and the second semiconductor layer using the patterned hard mask layer as a mask exposing a
(Continued)

surface of the graded doping layer to form a plurality of fins surrounded by a trench.

20 Claims, 28 Drawing Sheets

Related U.S. Application Data division of application No. 16/929,926, filed on Jul. 15, 2020, now Pat. No. 11,335,810.

(60) Provisional application No. 62/877,224, filed on Jul. 22, 2019.

(58) Field of Classification Search
CPC ........... H01L 29/78681; H01L 29/7786; H01L 29/7787; H01L 29/7788; H01L 21/02694; H01L 21/0415; H01L 21/046; H01L 21/0465; H01L 21/047; H01L 21/2056; H01L 21/2215; H01L 21/2252; H01L 21/2253; H01L 21/265; H01L 29/78621; H01L 29/41725–41791; H01L 29/4236; H01L 29/41775; H01L 29/66575–66598; H01L 21/266; H01L 21/26553; H01L 21/26586; H01L 21/28044; H01L 21/28061; H01L 21/28079; H01L 21/28088; H01L 21/3006; H01L 21/31155; H01L 21/3245; H01L 21/2654; H01L 21/47576; H01L 21/4763; H01L 21/7682; H01L 21/76859; H01L 21/823814; H01L 21/82385; H01L 2029/7863; H01L 29/7856; H01L 29/7783; H01L 29/66803; H01L 29/6653; H01L 29/66924; H01L 29/36; H01L 29/8083; H01L 29/66431; H01L 29/122–127; H01L 29/15–158; H01L 29/432; H01L 29/205; H01L 29/452; H01L 29/475; H01L 29/0657; H01L 29/0638; H01L 29/0684; H01L 29/7853; H01L 29/778–7789; H01L 29/66795; H01L 2924/13064

USPC .................. 257/211, 401, 76, 194, 256, 288, 257/E29.246, E29.255, E29.312; 438/327, 308, 349, 358, 378, 394, 618, 438/912, 798
See application file for complete search history.

(56) References Cited

U.S. PATENT DOCUMENTS

| | | | |
|---|---|---|---|
| 7,355,223 B2* | 4/2008 | Harris | H01L 29/8083 438/137 |
| 7,719,055 B1* | 5/2010 | McNutt | H01L 29/0843 257/280 |
| 9,006,800 B2* | 4/2015 | Romano | H01L 29/66916 438/192 |
| 11,335,810 B2* | 5/2022 | Drowley | H01L 29/7788 |
| 2011/0133211 A1 | 6/2011 | Malhan et al. | |
| 2012/0241766 A1 | 9/2012 | Ohtsuka et al. | |
| 2013/0161635 A1 | 6/2013 | Brown et al. | |
| 2013/0299873 A1 | 11/2013 | Disney et al. | |
| 2014/0264369 A1 | 9/2014 | Padmanabhan et al. | |
| 2015/0097226 A1 | 4/2015 | Lichtenwalner et al. | |
| 2015/0340476 A1 | 11/2015 | Kizilyalli et al. | |
| 2017/0170283 A1 | 6/2017 | Laboutin et al. | |
| 2017/0288030 A1 | 10/2017 | Cheng et al. | |
| 2017/0358651 A1 | 12/2017 | Lu et al. | |
| 2019/0207020 A1 | 7/2019 | Lin et al. | |
| 2019/0237552 A1 | 8/2019 | Laroche | |
| 2019/0371911 A1 | 12/2019 | Miao et al. | |

OTHER PUBLICATIONS

U.S. Appl. No. 16/929,926, "Notice of Allowance", Jan. 13, 2022, 7 pages.
U.S. Appl. No. 17/719,221, "Non-Final Office Action", Dec. 8, 2022, 17 pages.
U.S. Appl. No. 17/719,221, "Notice of Allowance", Apr. 12, 2023, 7 pages.

* cited by examiner

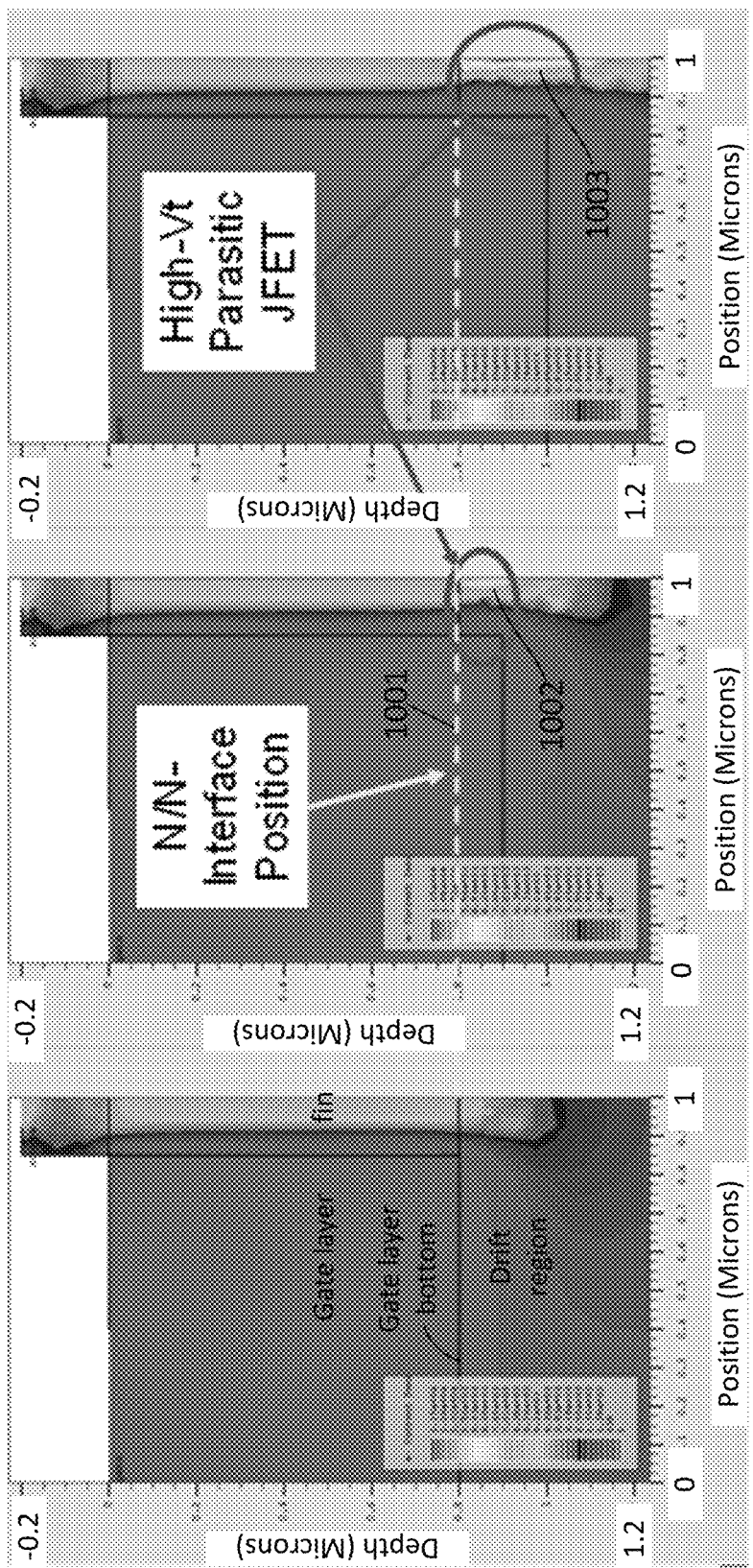
FIG. 9A  Nominal
FIG. 9B  0.1 um OE
FIG. 9C  0.2 um OE

METHOD AND SYSTEM FOR FABRICATION OF A VERTICAL FIN-BASED FIELD EFFECT TRANSISTOR

CROSS-REFERENCES TO RELATED APPLICATIONS

This application is a continuation of U.S. patent application Ser. No. 17/719,221, filed on Apr. 12, 2022, now U.S. Pat. No. 11,735,671, issued on Aug. 22, 2023, which is a division of U.S. patent application Ser. No. 16/929,926, filed on Jul. 15, 2020, now U.S. Pat. No. 11,335,810, issued on May 17, 2022, which claims the benefit of and priority to U.S. Provisional Patent Application No. 62/877,224, filed on Jul. 22, 2019, the disclosures of which are hereby incorporated by reference in their entirety for all purposes.

TECHNICAL FIELD

The present invention relates to vertical fin-based field effect transistor (FET) devices with an improved combination of leakage current, maximum electric field, and on-resistance for a given threshold voltage.

BACKGROUND OF THE INVENTION

Power electronics are widely used in a variety of applications, including power conversion, electric motor drives, switching power supplies, lighting, etc. Power electronic devices such as transistors are commonly used in such power switching applications. The operation of the present generation of power transistor devices, particularly with high voltage (>600V) handling capability, is hampered by slow switching speeds, and high specific on-resistance.

Thus, there is a need in the art for power transistor devices exhibiting low capacitance, a low, positive threshold voltage, and low specific on-resistance along with high breakdown voltage.

SUMMARY OF THE INVENTION

Embodiments of the present invention provide novel vertical-fin-based FET devices and methods of fabricating such FET devices with improved specific on-resistance, leakage current and breakdown voltage.

In one embodiment, a transistor includes a substrate having a first surface and a second surface opposite the first surface, a drift region having a doped region on the first surface of the substrate and a graded doping region on the doped region, a semiconductor fin protruding from the graded doping region and comprising a metal compound layer at an upper portion of the semiconductor fin, a source metal contact on the metal compound layer, a gate layer having a bottom portion directly contacting the graded doping region, and a drain metal contact on the second surface of the substrate.

In another embodiment, a method of fabricating a vertical-fin-based field effect transistor (FET) is provided. The method may include providing a semiconductor substrate having a first surface and a second surface, the semiconductor substrate having a first conductivity type, epitaxially growing a first semiconductor layer on the first surface of the semiconductor substrate, the first semiconductor layer having the first conductivity type and including a drift layer and a graded doping layer on the drift layer, epitaxially growing a second semiconductor layer (also referred to as a fin conduction layer) having the first conductivity type on the graded doping layer, forming a metal compound layer on the second semiconductor layer, forming a patterned hard mask layer on the metal compound layer, and etching the metal layer and the second semiconductor layer (i.e., the fin conduction layer) using the patterned hard mask layer as a mask exposing a surface of the graded doping layer to form a plurality of fins that are surrounded by a trench. The method may also include epitaxially growing a third semiconductor layer having a second conductivity type opposite the first conductivity type in the trench, etching back the third semiconductor layer and planarizing the third semiconductor layer and exposing a sidewall portion of the fins, forming a first dielectric layer on the planarized third semiconductor layer and overlying the patterned hard mask layer and the sidewall portion of the fins, forming a second dielectric layer on the first dielectric layer, forming a third dielectric layer on the second dielectric layer, and etching back the third dielectric layer to form a spacer on sidewalls of the second dielectric layer.

In one embodiment, the method may further include removing a portion of the second dielectric layer that is not covered by the spacer while exposing an upper surface portion of the first dielectric layer over the planarized third semiconductor layer, and removing the spacer and the patterned hard mask.

In one embodiment, the first dielectric layer includes $Si_3N_4$, the second dielectric layer includes $SiO_2$, and the third dielectric layer includes $Si_3N_4$. In one embodiment, the first dielectric layer has a thickness of about 100 nm, the second dielectric layer has a thickness of about 100 nm, and the third dielectric layer has a thickness of about 400 nm. Each of the first, second, and third dielectric layers can be formed by PECVD at a temperature of about 300° C.

Numerous benefits are achieved by way of the present invention over conventional techniques. For example, embodiments of the present invention provide methods and systems that utilize (1) a graded doping region as landing zone for etching of the vertical fin, thereby minimizing the impact of etch depth variation in the etch process on the on-resistance and gate-to-source capacitance of the FET, (2) a self-aligned source contact to reduce or eliminate alignment issues in the contact formation and thereby minimize parasitic capacitances, and (3) an epitaxially-regrown gate layer on the graded doping region with a ternary III-V compound on a binary III-V compound substrate.

The difference between the lattice constant of the ternary III-V compound gate layer and the binary III-V compound substrate and the induced strain generates a polarization charge which results in a two-dimensional electron gas (2DEG) at the interface with the gate layer. The 2DEG enables a current to first flow substantially in the horizontal direction along the lateral bottom surface of the gate layer, then in the vertical direction through the drift region, thereby reducing spreading resistance in the device and reducing the device specific on resistance. By controlling the etched depth into the graded doping region, the drain-source ON resistance, the threshold voltage, the electric field and the drain-source leakage current can kept within a desired range. Additionally, some embodiments include applications to merged p-i-n/Schottky (MPS) diodes and to vertical MOSFETs. In particular, the use of an epitaxially regrown ternary III-V compound as the p-type region in an MPS diode can reduce the on-voltage of the diode. The graded doping region landing zone has similar advantages for vertical MOSFETs as for vertical JFETs, and the self-aligned source contact can also be applied to vertical MOSFET structures. These and other embodiments of the invention along with many of its advantages and features are described in more detail in conjunction with the text below and attached figures.

BRIEF DESCRIPTION OF THE DRAWINGS

The accompanying drawings form a part of the present disclosure, that describe exemplary embodiments of the present invention. The drawings together with the specification will explain the principles of the invention.

FIG. 9A is a graph illustrating a current density for a normal etch. FIG. 9B is a graph illustrating a current density for a 0.1 μm overetch. FIG. 9C is a graph illustrating a current density for a 0.2 μm overetch.

DETAILED DESCRIPTION OF SPECIFIC EMBODIMENTS

Figure 1:
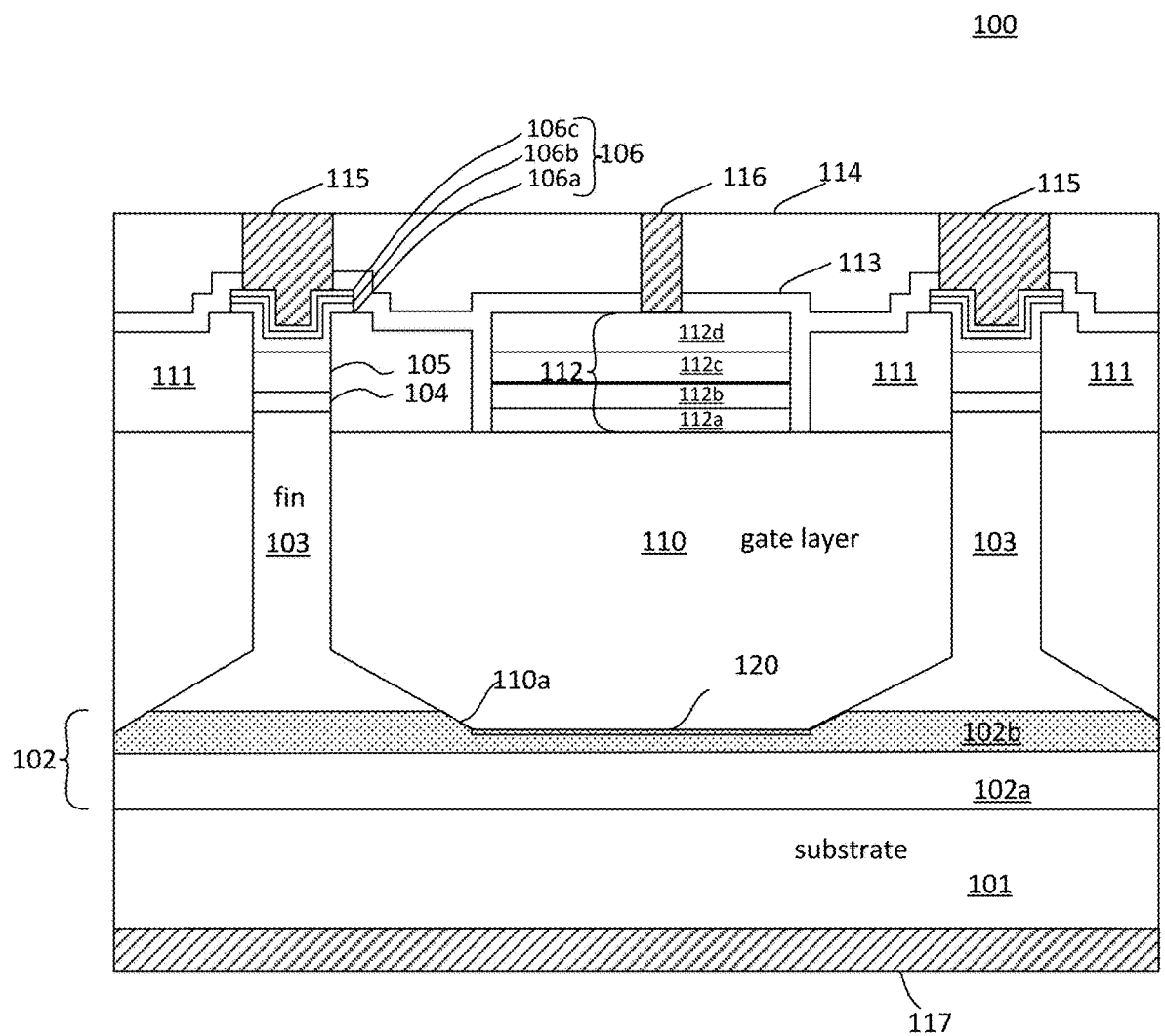
FIG. 1 is a cross-sectional view of a vertical-fin-based field effect transistor (FET) device according to an embodiment of the present disclosure.

Embodiments of the present disclosure will be described more fully hereinafter with reference to the accompanying drawings. The disclosure may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly, indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the present disclosure are described herein with reference to cross-sectional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present disclosure now will be described more fully hereinafter with reference to the accompanying drawings, in which embodiments of the invention are shown. This disclosure may, however, be embodied in many different forms and should not be construed as limited to the embodiments set forth herein. Rather, these embodiments are provided so that this disclosure will be thorough and complete, and will fully convey the scope of the invention to those skilled in the art.

Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

Embodiments of the present disclosure relates to vertical-fin-based field effect transistor (FET) devices. More particular, the present disclosure relates to vertical fin-based FET devices with improved leakage current, maximum electric field and on-resistance for a given threshold voltage. Merely by way of example, the present disclosure relates to methods and vertical transistor devices with a graded doping zone in the doped drift region, and a regrowth of epitaxial gate layer in direct contact with the graded doping zone. Many advantages can be obtained by having the epitaxially regrown gate layer on the graded doping zone, such as improved on-resistance, maximum electric field, current flow first in the lateral direction along the bottom interface layer of the gate layer than in the vertical direction through the drift layer toward the substrate.

FIG. 1 is a cross-sectional view of a vertical fin-based field effect transistor device 100 according to an embodiment of the present disclosure. The terms "FET," "FinFET," and "vertical fin-based FET" are interchangeably used herein. Referring to FIG. 1, FET device 100 may include a semiconductor substrate 101, a drift layer 102 including a uniformly doped region 102a on semiconductor substrate 101 and a graded doping region 102b on uniformly doped region 102a, and a plurality of fins 103 protruding from graded doping region 102b. In one embodiment, each of the fins 103 may include a heavily doped layer 104 disposed in an upper portion of the fin and a refractory metal, refractory metal compound or refractory metal alloy layer (e.g., a TiN layer) 105 disposed on heavily doped layer 104. FET device 100 may also include a source contact structure 106 on metal layer (TiN) 105. Source contact structure 106 may include a titanium (Ti) layer 106a on metal layer (TiN) 105, an aluminum (Al) layer 106b on titanium (Ti) layer 106a, and a barrier metal layer (e.g., molybdenum (Mo), titanium (Ti), tantalum (Ta), or similar) 106c on aluminum (Al) layer 106b.

FET device 100 may further include a gate layer 110 having a bottom portion in direct contact with graded doping region 102b, a dielectric (e.g., silicon dioxide or silicon nitride) layer 111 disposed on gate layer 110 and surrounding fins 103, a gate contact structure 112 disposed on gate layer 110, a first interlayer dielectric layer 113 disposed on dielectric layer 111 and gate contact structure 112, and a second interlayer dielectric layer 114 disposed on first interlayer dielectric layer 113. In one embodiment, gate contact structure 112 may include a nickel (Ni) layer 112a disposed on gate layer 110, a first gold (Au) layer 112b disposed on nickel (Ni) layer 112a, a barrier metal (e.g., molybdenum (Mo), titanium (Ti), tantalum (Ta), or similar) layer 112c disposed on first gold (Au) layer 112b, and a second gold (Au) layer 112d disposed on barrier layer 112c.

FET device 100 may also include a first via contact 115 extending through first and second interlayer dielectric layers 113, 114 and in contact with source contact structure 106, a second via contact 116 extending through first and second interlayer dielectric layers 113, 114 and in contact with gate contact structure 112, and a drain metal contact 117 on the bottom surface of semiconductor substrate 101. As used herein, the terms "drift layer" and "drift region" are used interchangeably, the terms "doped layer" and "doped region" are used interchangeably, and the terms "graded doping region" and "graded doping layer" are used interchangeably.

In some embodiments, semiconductor substrate 101 may include an N+ doped III-nitride material, fins 103 may include an N doped III-nitride material having a first dopant concentration, uniformly doped region 102a of drift region 102 may include an N doped III-nitride material having a second dopant concentration lower than the first dopant concentration, and graded doping region 102b having a third dopant concentration that increases (e.g., linearly) from the second dopant concentration to the first dopant concentration.

In one embodiment, the first dopant concentration is about $7.5 \times 10^{16}$ atoms/cm$^3$, and the second dopant concentration is about $1 \times 10^{16}$ atoms/cm$^3$.

In one embodiment, the drift region has a thickness of about 12 μm, the graded doping region has a thickness of about 0.3 μm, and the semiconductor fin has a height in a range between about 0.7 μm and 0.8 μm and a width of about 0.2 μm.

In one embodiment, gate layer 110 may include an $In_xGa_{1-x}N$ layer, where 0<x<1, i.e., x is between 0 and 1 and is not equal to 0 or 1. In one embodiment, gate layer 110 is disposed in a recess region between two adjacent fins and has a portion 110a in contact with graded doping region 102b. The depth (or the thickness) of portion 110a of the gate layer may affect the threshold voltage, the conductance, the maximum electric field of the FET device. The effect of the depth (or thickness) of portion 110a embedded in the graded doping region will be described in more detail below.

In one embodiment, the FET device 100 may include a substrate 101 which may include an N+ GaN material layer, a drain metal layer 117 disposed at its bottom surface, an N GaN drift layer 102 having a uniformly doped region 102a disposed on substrate 101 and a graded doping region 102b disposed on the uniformly doped region, and an epitaxial GaN layer disposed on the graded doping region and including a recess region for forming a plurality of fins 103. The FET device may also include a p-type GaN gate layer filling the recess region. The graded doping region 102b may function as a landing pad to ensure sufficient contact for gate layer 110. In one embodiment, the gate layer may include a ternary compound semiconductor layer (e.g., an $In_xGa_{1-x}N$ layer, where 0<x<1). In one embodiment, portion 110a of the gate layer 110 may have a depth (or thickness) of about 0.1 μm (+/−0.1 μm) extending into graded doping region 102b. The fins each may have a width of about 0.2 μm and are spaced from each other by a space of about 2.0 μm, i.e., the recess region or the gate layer filling the recess region between two adjacent fins has a lateral width of about 2.0 μm. The FET device may also include a two-dimensional electron gas (2DEG) layer 120 formed in an interface between gate layer 110 and graded doping region 102b. The area surface of gate layer 110 is large, so that a current flows laterally along 2DEG layer 120 before flowing vertically toward drain metal layer 117 in the direction of the substrate, thereby improving the conductance (reducing the on-resistance) of the FET device. In other words, the channel FET device has two portions, with a first portion being a lateral channel that controls the current flow through the 2DEG layer, which distributes the current efficiently in the drift region, and a second portion being a vertical channel which carries the current vertically through the drift region toward substrate 101 and drain metal layer 117.

In one embodiment, each of the fins may include a metal layer 105 made of TiN and a multilayer source metal structure 106 (e.g., stacked layers of Ti/Al or Ti/TiN/Al in which Ti is in contact with metal layer 105). The FET device may also include an insulating layer 111, e.g., a silicon dioxide or silicon nitride layer on gate layer 110, which may also be referred to as a dielectric layer. Insulating layer 111 includes an opening where a gate contact structure (gate electrode) 112 is formed in contact with gate layer 110. Gate contact structure (gate electrode) 112 has a multilayer structure of metals, e.g., Pd/Pt/Au, where Pd is in contact with gate layer 110, or Ni and Au, in which the Ni is deposited in contact with gate layer 110. Other embodiments can include other gate electrode metal structures known to those skilled in the art.

In one embodiment, each of the fins may include an upper portion having sidewalls parallel to each other and substantially perpendicular to the surface of the substrate and a lower portion having sidewalls non-parallel to each other and forming an angle other than 90 degrees with the surface of the substrate. The parallel sidewalls may define a nonpolar plane, such as an m-plane.

In one embodiment, the 2DEG layer is induced by a polarization between the gate layer and the drift region in a c-plane, and the current flowing vertically through the drift region is along an m-plane.

Figure 2:
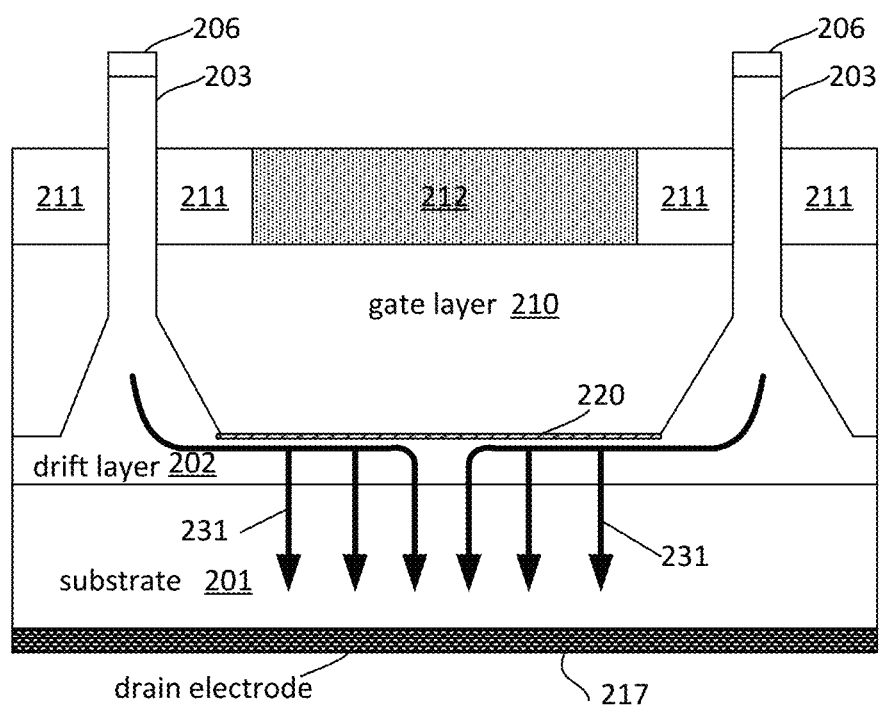
FIG. 2 is a simplified cross-sectional view of a vertical-fin-based FET device illustrating current flow from a lateral direction along a two-dimensional electron gas (2DEG) to a vertical direction toward the substrate according to an embodiment of the present disclosure.

FIG. 2 is a simplified cross-sectional view of a vertical FET device 20 illustrating a current flow from a lateral direction along a 2DEG to a vertical direction toward the substrate according to an embodiment of the present disclosure. Referring to FIG. 2, vertical FET device may include a substrate 201, a drift layer 202 overlying substrate 201, a plurality of fins 203 protruding from a surface of drift layer 202, a gate layer 210 on drift layer 202 and surrounding the fins. FET device 20 may further include a gate electrode 212 on gate layer 210, and a dielectric layer (e.g., silicon dioxide) 211 on gate layer 210 and surrounding fins 203 and gate electrode 212. FET device 20 may also include a two-dimensional electron gas 220 where gate layer 220 meets drift layer 202 along the polar plane directions. FET device 20 may also include a source electrode 206 coupled to fins 203. FET device 20 is in an off-state when no electrical potential is applied to gate electrode 212.

When an electrical potential is applied to gate electrode 212, it modulates a continuous two-dimensional electron gas (2DEG) 220 that is electrically communicative with the drain electrode. The source current 231 flows laterally under gate layer 210 and vertically into drain electrode 217. In one embodiment, the fins each have a width of about 0.2 μm and spaced apart by a distance of about 2.0 μm. A polarization induced 2DEG 220 is formed in the interface between the gate layer and the graded doping region of the drift region, thereby distributing the current in the drift region to improve the conductance of the FET device.

Figure 3:
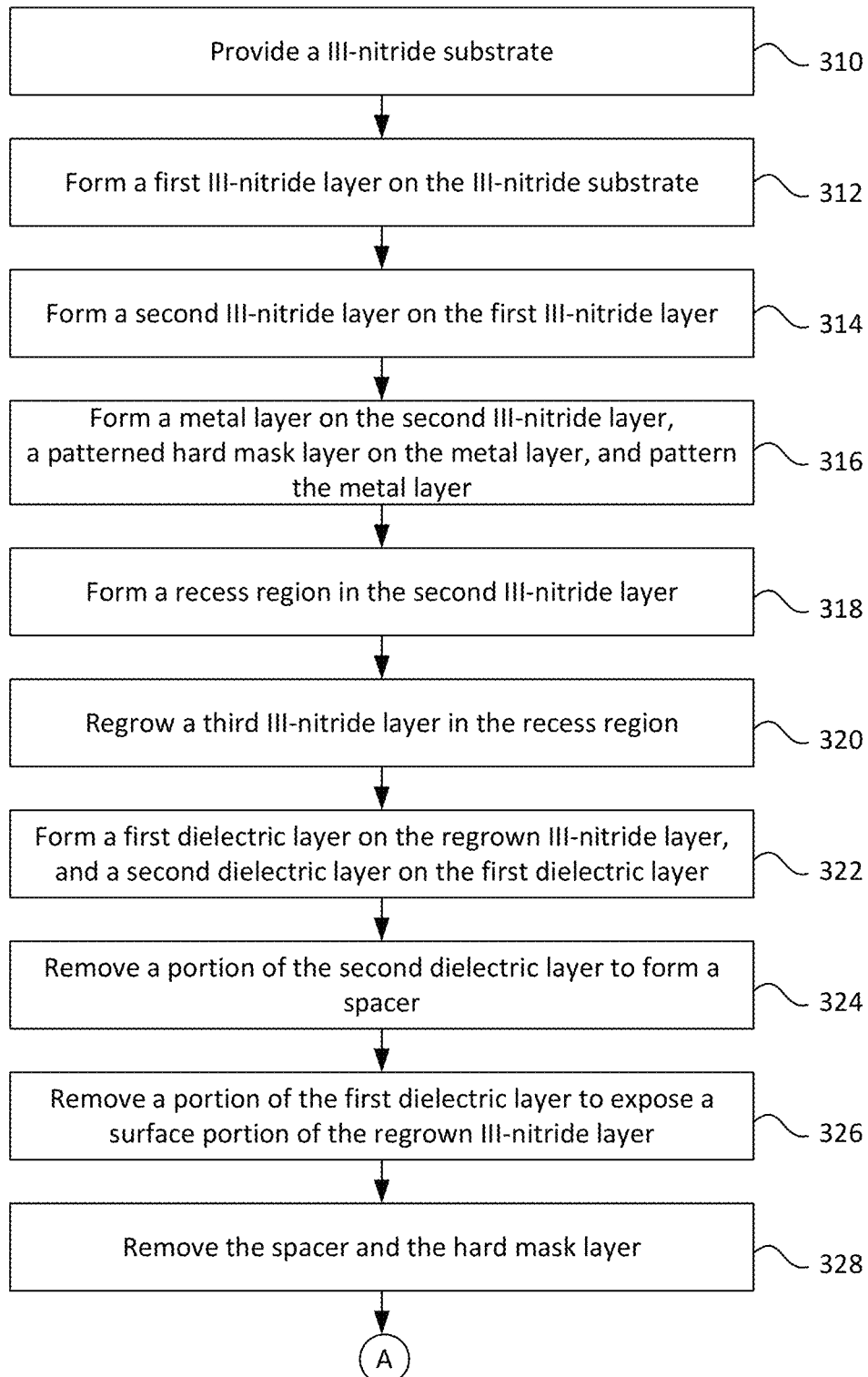
FIG. 3 is a simplified flowchart of a method of fabricating a vertical-fin-based FET device according to an embodiment of the present disclosure.
Figure 3:
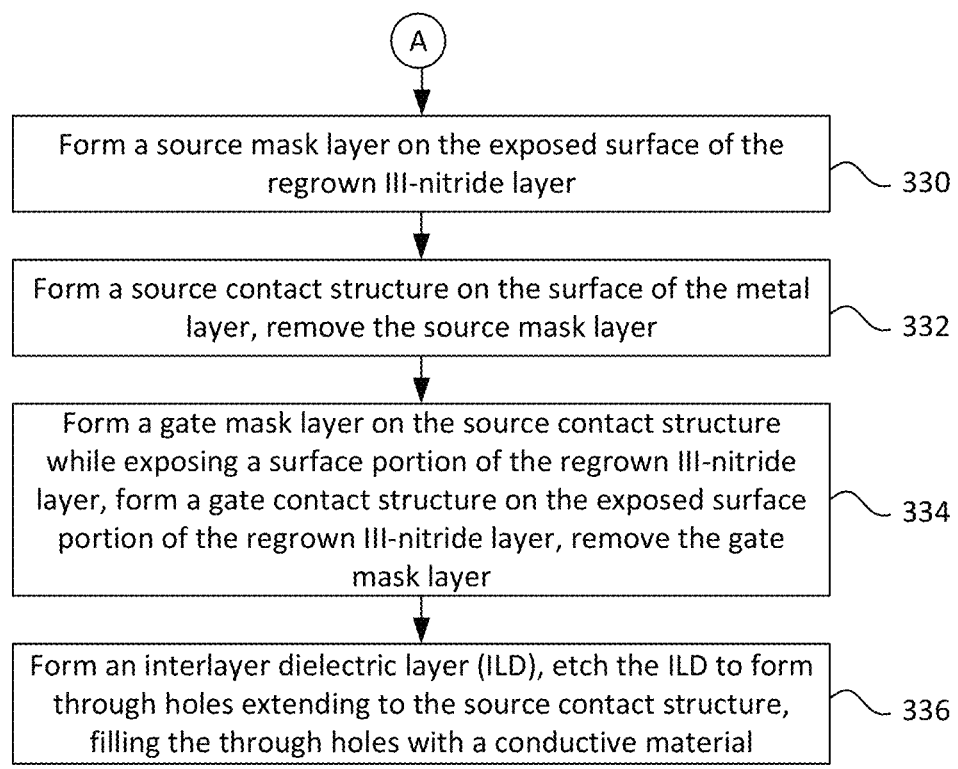

Embodiments of the present disclosure further provide a method of fabricating a vertical FET device. FIG. 3 is a simplified flowchart of a method 300 of fabricating a vertical FET device with a regrown gate layer according to an embodiment of the present disclosure. Referring to FIG. 3, a III-nitride substrate is provided (310). In an embodiment, the III-nitride substrate is an N+ GaN substrate having a resistivity in a range of about 0.020 ohm-cm. In one embodiment, the resistivity of the N+ GaN substrate may be from about 0.001 ohm-cm to 0.018 ohm-cm, preferably less than 0.016 ohm-cm, and more preferably, less than 0.012 ohm-cm. Method 300 also includes forming a first III-nitride epitaxial layer, for example, a 12 μm thick first III-nitride epitaxial layer (e.g., an N− GaN epitaxial layer deposited on the III-nitride substrate (312). The first III-nitride epitaxial layer is epitaxially grown on the III-nitride substrate at a temperature between 950 and 1100° C. and is characterized by a first dopant concentration, e.g., N-type doping with a dopant concentration of about $1\times10^{16}$ atoms/cm³. In some embodiments, the first III-nitride epitaxial layer is a drift layer including a uniformly doped region (layer) on the III-nitride substrate and a graded doping region (layer) on the uniformly doped region. In an embodiment, the uniformly doped region has a thickness of about 12 μm, and the graded doping region has a thickness of about 0.3 micron. In an embodiment, the surface of substrate 310 is miscut from the c-plane at an angle to facilitate high-quality epitaxial growth for high-voltage operation of the drift layer.

Method 300 further includes forming a second III-nitride epitaxial layer on the first III-nitride epitaxial layer (314). In an embodiment, the second III-nitride epitaxial layer is epitaxially grown on the first III-nitride epitaxial layer with a thickness of about 0.7 μm and is characterized by a second dopant concentration, e.g., N-type doping. The second dopant concentration is higher than the first dopant concentration in some embodiments. In an embodiment, the second dopant concentration is about $1.3 \times 10^{17}$ atoms/cm$^3$. Method 300 further includes forming a metal layer on the second III-nitride epitaxial layer and a patterned hard mask layer on the metal layer (316), and patterning the metal layer using the patterned hard mask layer as a mask. Method 300 further includes forming a recess region in the second III-nitride epitaxial layer using the patterned hard mask layer by an etch process, e.g., a reactive ion etching (RIE) process (318). Method 300 further includes regrowing a third III-nitride epitaxial layer in the recess region (320). The regrown III-nitride epitaxial layer may form a gate layer. In one embodiment, the regrown III-nitride epitaxial layer has a conductivity type opposite the conductivity type of the first and second III-nitride epitaxial layers.

Method 300 further includes forming a first dielectric layer on the regrown III-nitride epitaxial layer and on the patterned hard mask layer and a second dielectric layer on the first dielectric layer (322). Method 300 further includes removing a portion of the second dielectric layer to form a spacer on sidewalls of the first dielectric layer on opposite sides of an upper portion of the fins (324). Method 300 further includes removing a portion of the first dielectric layer to expose a surface portion of the regrown III-nitride epitaxial layer while leaving a portion of the first dielectric layer on opposite sides of the fins (326). Method 300 further includes removing the spacer and the hard mask layer while exposing a surface of the metal layer and keeping the portion of the first dielectric layer on opposite sides of the fins (328).

Method 300 further includes forming a source mask layer on the exposed surface portion of the regrown epitaxial III-nitride layer (330). Method 300 further includes forming a source contact structure on the surface of the metal layer and removing the source mask layer (332). Method 300 further includes forming a gate mask layer covering the source contact structure while exposing a surface portion of the regrown III-nitride epitaxial layer, forming a gate contact structure on the exposed surface portion of the regrown III-nitride epitaxial layer, and removing the gate mask layer (334). Method 300 further includes forming an interlayer dielectric layer covering the source contact structure and the gate contact structure, forming a patterned mask layer on an interlayer dielectric layer, etching the interlayer dielectric layer to form through holes extending to the source contact structure, and filling the through holes with a conductive material to form vias (336). It is noted that the through holes and vias to the gate contact structure can be formed concurrently with the formation of the through holes and vias to the source contact structure.

It should be appreciated that the specific steps illustrated in FIG. 3 provide a particular method of fabricating a vertical FET device with a regrown gate layer according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular application. One of ordinary skill in the art would recognize many variations, modifications, and alternatives.

Figure 4A:
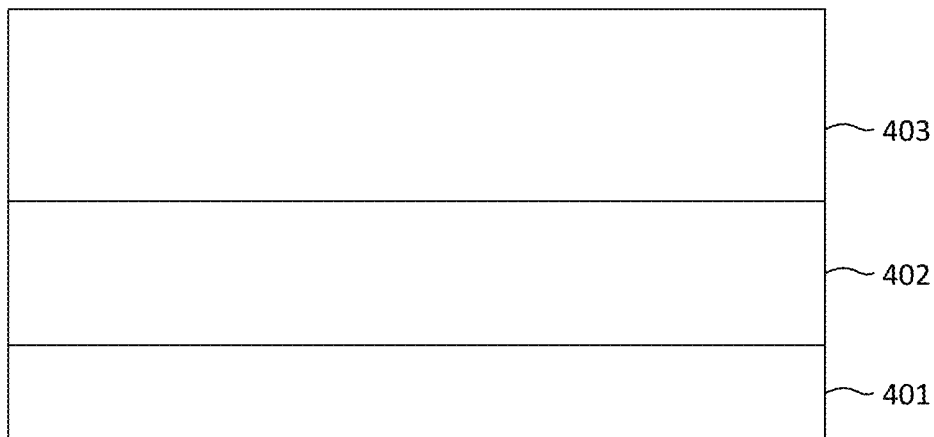
FIGS. 4A through 4D are cross-sectional views showing intermediate stages of methods of fabricating a vertical-fin-based FET device according to an embodiment of the present disclosure.
Figure 4B:
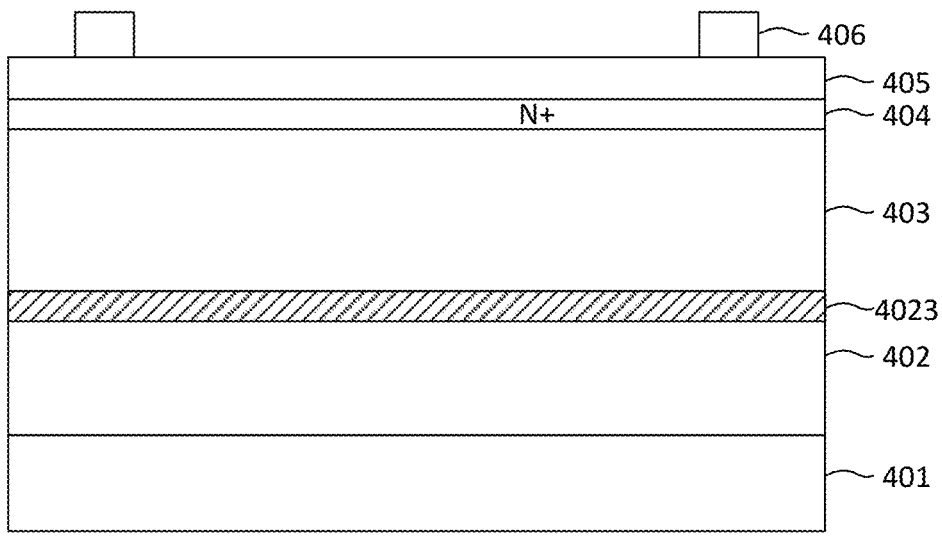

Referring once again to FIG. 3 and with reference to FIGS. 4A through 4P, a method of fabricating a vertical FET device is described according to some embodiments of the present disclosure. Referring to FIG. 4A, an N+ doped III-nitride substrate 401 is provided (block 310). A first N– doped semiconductor (drift) layer 402 semiconductor layer 402 is epitaxially grown on substrate 401 (block 312) at a temperature between 950 and 1200° C., preferably between 1000 and 1150° C., and more preferably about 1100° C. A second N doped semiconductor layer 403 is epitaxially grown on first semiconductor layer 402 (block 314) at a temperature between 950 and 1200° C., preferably between 1000 and 1150° C., and more preferably about 1100° C. Referring to FIG. 4B, a metal layer 405 is formed on second semiconductor layer 403, and a patterned hard mask layer 406 is formed on metal layer 405 (block 316). In an embodiment, a hard mask layer may include Si$_3$N$_4$ and is formed with a thickness of about 400 nm by PECVD at about 300° C. In an embodiment, patterned hard mask layer 406 may be formed using RIE with F-based chemistry. In an embodiment, metal layer 405 is omitted.

In an embodiment, N+ doped III-nitride substrate 401 is heavily doped with N-type dopants in a dopant concentration in a range of about $5 \times 10^{17}$ atoms/cm$^3$ to about $1 \times 10^{19}$ atoms/cm$^3$ and a resistivity of less than 0.020 ohm-cm. In one embodiment, the resistivity of the N+ doped III-nitride substrate may be from about 0.001 ohm-cm to 0.018 ohm-cm, preferably less than 0.016 ohm-cm, and more preferably, less than 0.012 ohm-cm. First semiconductor layer 402 is a drift layer having a thickness of about 12 μm and a dopant concentration in a range of about $1 \times 10^{16}$ atoms/cm$^3$. Second semiconductor layer 403 is a fin conduction layer having a uniform doped region with N-type dopants of about $1.3 \times 10^{17}$ atoms/cm$^3$ and a thickness of about 12 μm. A graded doping region 4023 having a thickness of about 0.3 μm is disposed between the first and second semiconductor layers and has a dopant concentration that increases (e.g., linearly) from about $1 \times 10^{16}$ atoms/cm$^3$ to $1.3 \times 10^{17}$ atoms/cm$^3$, i.e., from the first semiconductor layer toward the second semiconductor layer. Metal layer 405 may include TiN, and hard mask layer 406 may include silicon nitride. In one embodiment, a heavily N+ doped layer 404 may be present between second semiconductor layer 403 and metal layer 405 to improve contact resistance between the second semiconductor layer and the metal layer. In the following drawings and figures, graded doping region 4023 and heavily N+ doped layer 404 are omitted for the sake of clarity.

Figure 4C:
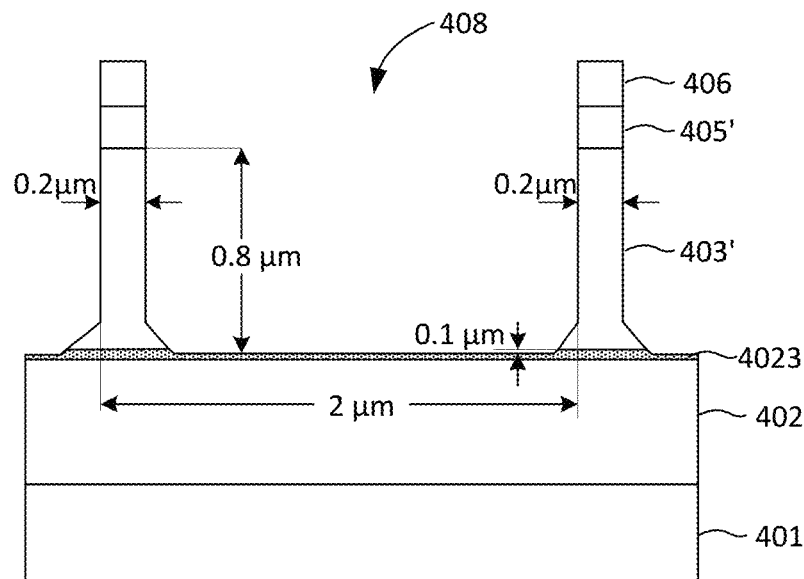

Referring to FIG. 4C, an etch process is performed using the patterned hard mask 406 as a mask to form a plurality of fins 403' and patterned metal contacts 405' (block 318). In some embodiments, the fins each have a width of about 0.2 μm, a height in a range between about 0.7 μm and 0.8 μm, and are spaced apart from each other by a space of about 2 μm, i.e., the fin pitch is about 2 μm. To have uniform height of the fins, good controllability of the depth of the etch process is utilized. In accordance with the present disclosure, an etch process may include Cl-based chemistry using RIE and is carried out to remove a portion of second semiconductor layer 403 to form a recess region 408. In an embodiment, the etch process may stop when about 0.1 μm of graded doping region 4023 is removed. The use of the graded doping region to mitigate the electrical effects of the etch process variation or tolerance is critical as will be described in detail further below.

It is noted that the bottom portion of the fins may have a shape different form the shape shown in FIG. 4C after the etch process. Embodiments of the present disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In the following drawings, the bottom portion of the fins are shown as having a 90 degrees angle with the surface of the graded doping region, i.e., the fins are shown as having a cross-sectional rectangular shape. It is understood that the bottom portion of the fins may have rounded or curved features. Thus, the regions illustrated in the figures are schematic in nature and their shapes are not intended to illustrate the actual shape of a region of a device and are not intended to limit the scope of the invention.

In one embodiment, after forming the trench, a cleaning process is carried using a TMAH solution of about 25% by weight, at a temperature of about 85° C., and for a duration of about 30 minutes. In another embodiment, prior to performing a cleaning using the TMAH solution, a pre-cleaning such as piranha clean using a $H_2SO_4$:$H_2O$ in a volume ratio 2:1 for 2 minutes may also be performed.

Figure 4D:
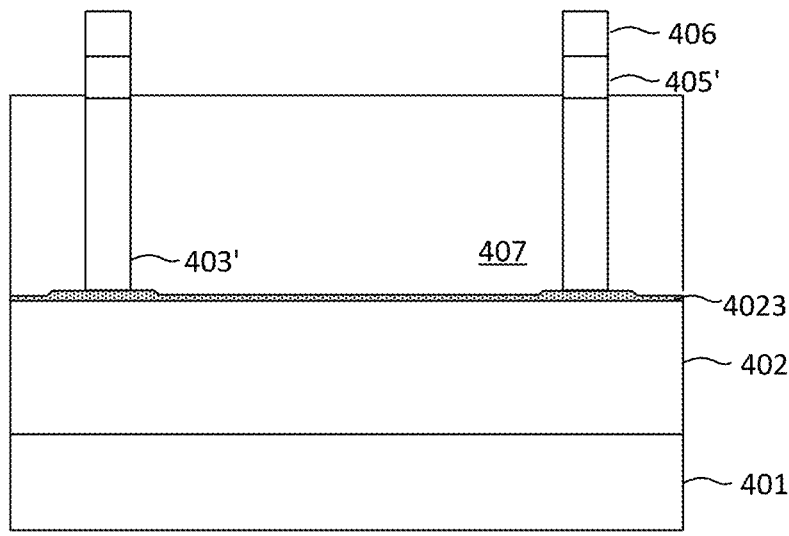
Figure 5A:
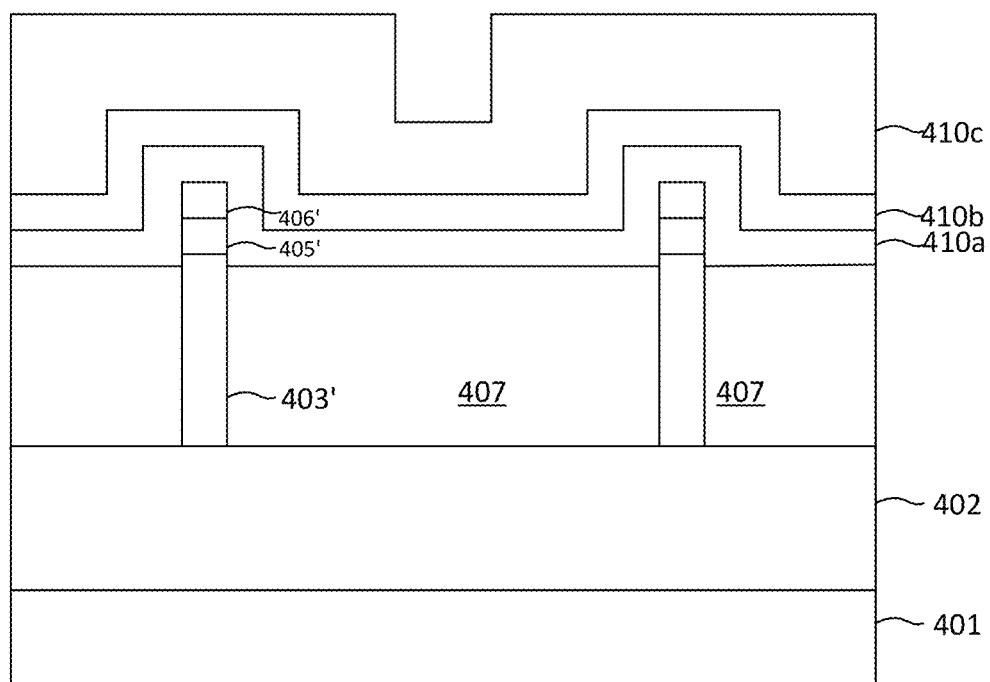
FIG. 5A through FIG. 5E are cross-sectional views showing intermediate stages of a method of fabricating a vertical-fin-based FET device according to a first embodiment of the present disclosure.

Referring to FIG. 4D, after the cleaning, a third semiconductor layer 407 is epitaxially grown in recess region 408 (block 320). In an embodiment, third semiconductor layer 407 may include a p-type GaN layer that is grown non-conformally in the trench at a temperature of about 950° C. up to a thickness that is substantially planar to the bottom of patterned metal contacts 405' (or hardmask 406, if patterned metal contacts 405' are omitted). In one embodiment, the thickness of third semiconductor layer 407 is about 840 nm. The p-type GaN layer may be doped with Mg with a dopant concentration of about $1 \times 10^{19}$ atoms/cm$^3$. The p-type GaN layer may be doped with Mg with a dopant concentration of about $1 \times 10^{19}$ atoms/cm$^3$. Thereafter, a thermal anneal (e.g., a rapid thermal annealing in $N_2$ at 850° C. for 5 minutes) is performed to activate the Mg dopant atoms. The Mg atoms are then activated in the p-type GaN layer in an amount of greater than 10% by weight. In one embodiment, a heavily N+ doped layer (as shown in FIG. 4B) may be present between fins 403' and patterned metal contacts 405' to improve contact resistance between the second semiconductor layer and the metal layer In a first embodiment, referring to FIG. 5A, a planarization process may be performed on third semiconductor layer 407. In an embodiment, the planarization process includes removing an upper portion of third semiconductor layer 407 by etching. In an embodiment, the planarization process includes removing about 0.2 μm of the upper portion of third semiconductor layer 407.

Thereafter, a first dielectric layer 410a is formed on at least the planarized surface of fourth dielectric semiconductor layer 407, and substantially conformal to the sidewall of the fin, the patterned metal contacts 405' and the hardmask 406. In an embodiment, the first dielectric layer 410a has a thickness of approximately 100 nm and may include $Si_3N_4$ and be deposited by PECVD at about 300° C. A second dielectric layer 410b is formed on first dielectric layer 410a. In an embodiment, second dielectric layer 410b has a thickness of approximately 100 nm and may include $SiO_2$ and be deposited by PECVD at about 300° C. A third dielectric layer 410c is formed on second dielectric layer 410b. In an embodiment, third dielectric layer 410c has a thickness of approximately 400 nm and may include $Si_3N_4$ and be deposited by PECVD at about 300° C.

Figure 5B:
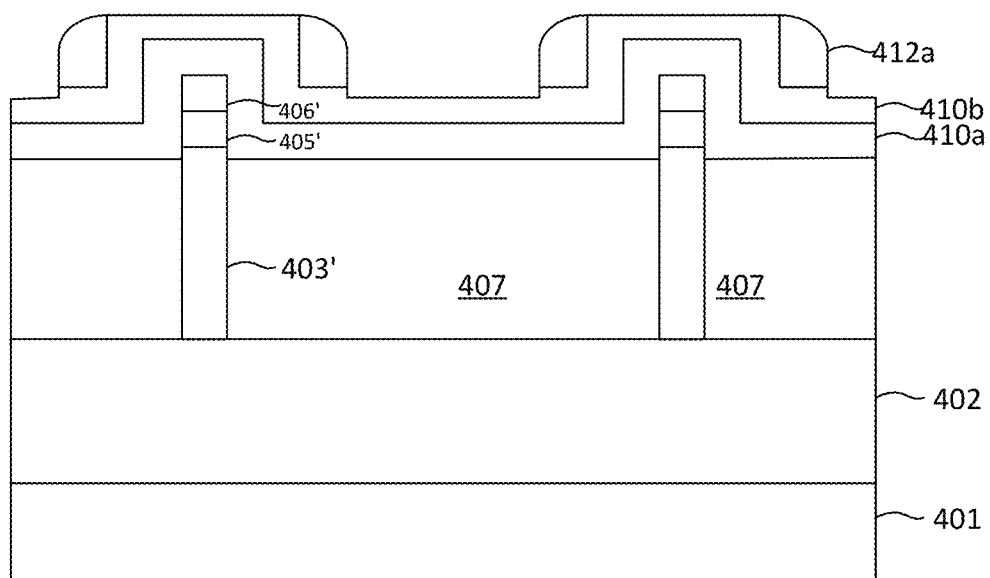

Referring to FIG. 5B, third dielectric layer 410c is etched back to form a spacer 412a on the sidewalls of second dielectric layer 410b. In one embodiment, spacer 412a has a width at the foot of about 300 nm.

Figure 5C:
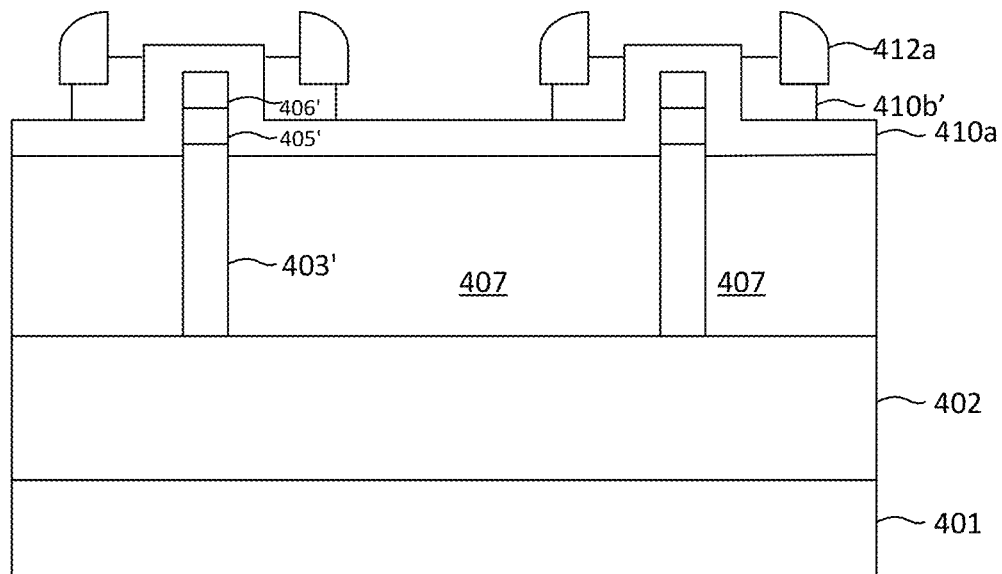

Referring to FIG. 5C, second dielectric layer 410b is etched using a substantially isotropic etch to expose the top of first dielectric layer 410a over planarized region 407 and over hardmask 406. In one embodiment, the etch uses a wet etchant such as buffered HF. In another embodiment, the etch uses a F-based plasma etch. After etching, the remaining portion of second dielectric layer 410b adjacent to spacer 412a is denoted 410b'.

Figure 5D:
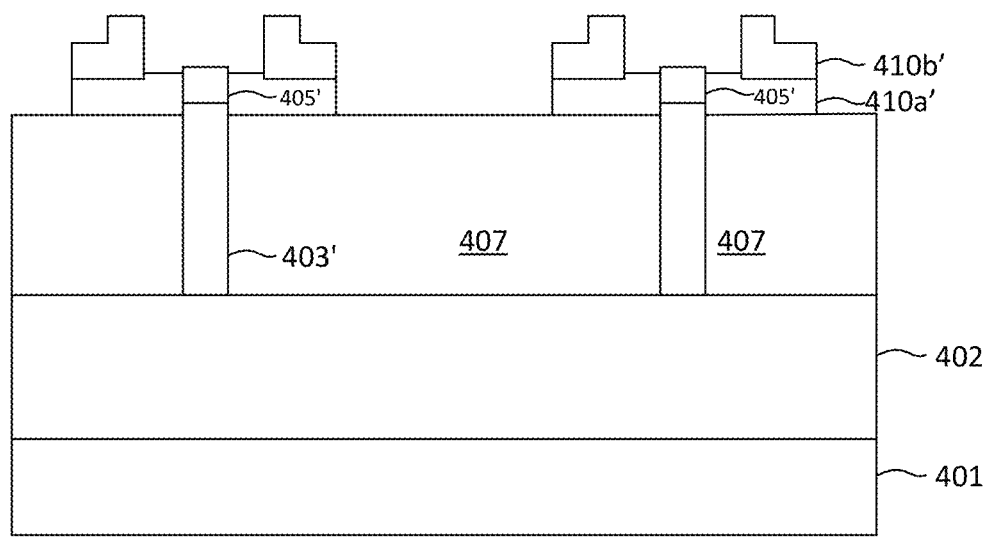

Referring to FIG. 5D, third dielectric layer 410c (spacer 412a), first dielectric layer 410a, and hardmask 406 are etched to expose the contact region over patterned metal contacts 405'. In one embodiment, patterned metal contacts 405' are omitted, and the contact region is the top of fin 403'.

Figure 5E:
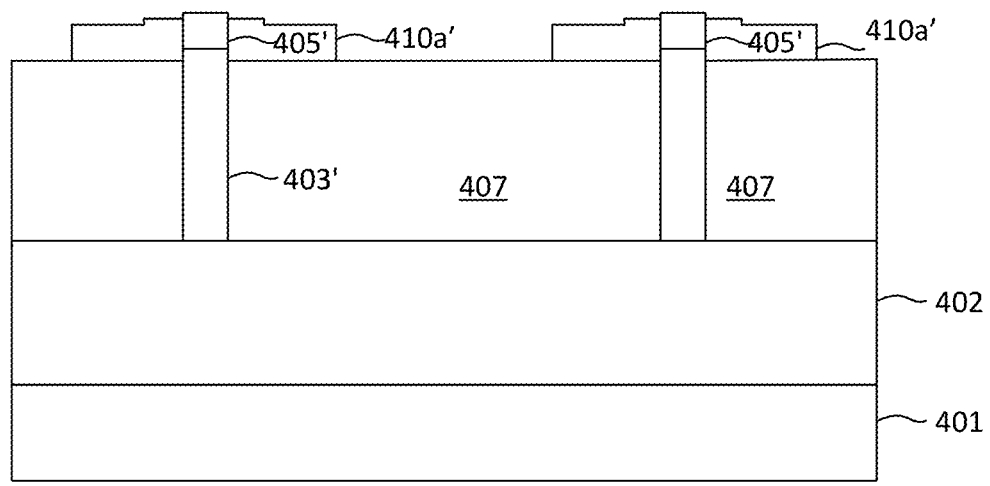

Referring to FIG. 5E, the remaining portion of second dielectric layer 410b' is etched to expose the remaining surface of first dielectric layer 410a.

FIG. 6A through FIG. 6D are cross-sectional views showing intermediate stages of a method of fabricating a vertical-fin-based FET device according to a second embodiment of the present disclosure. In the second embodiment, referring to FIG. 6A, a planarization process may be performed on third semiconductor layer 407. In an embodiment, the planarization process includes removing an upper portion of third semiconductor layer 407 by etching. In an embodiment, the planarization process includes removing about 0.2 μm of the upper portion of third semiconductor layer 407. Thereafter, a first dielectric layer 410 is formed on the planarized surface of fourth semiconductor layer 407, and a second dielectric layer 411 is formed on first dielectric layer 410 (block 322). In an embodiment, first dielectric layer 410 may include $SiO_2$ and be deposited by PECVD at about 300° C. Second dielectric layer 411 may include $Si_3N_4$ and be deposited by PECVD at about 300° C.

Figure 6A:
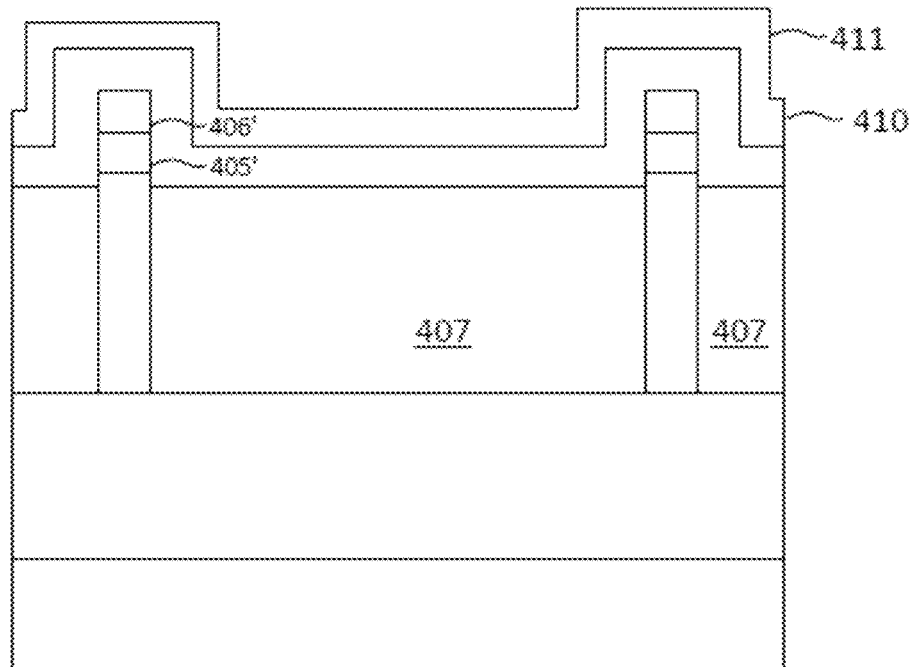
FIG. 6A through FIG. 6D are cross-sectional views showing intermediate stages of a method of fabricating a vertical-fin-based FET device according to a second embodiment of the present disclosure.
Figure 6B:
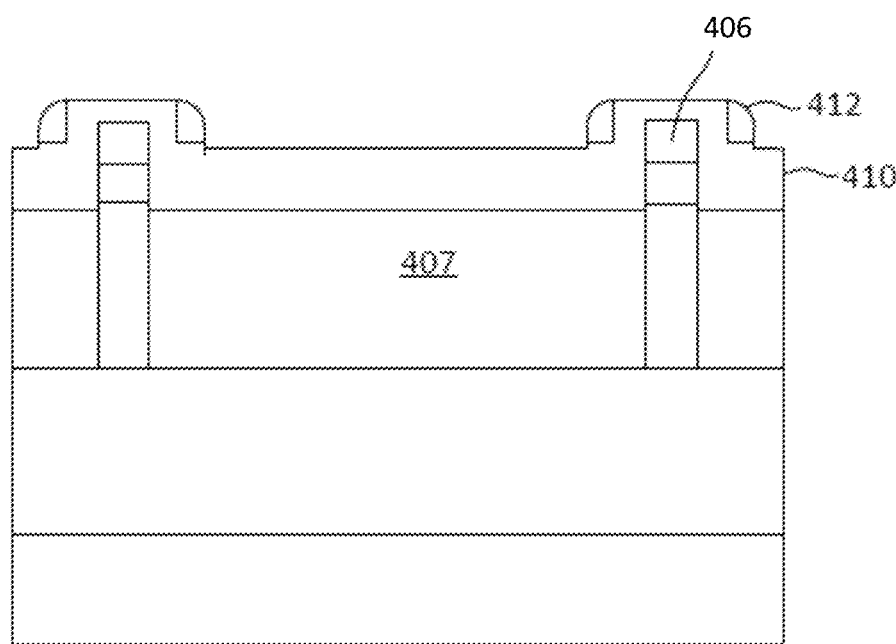

Referring to FIG. 6B, second dielectric layer 411 is etched back to form a spacer 412 having a thickness of about 2000 angstroms on sidewalls of first dielectric layer 410 (block 324). In one embodiment, first dielectric layer 410 is also etched back by a certain depth such that the upper surface of first dielectric layer 410 is within the thickness of hard mask layer 406, as shown in FIG. 6B.

Figure 6C:
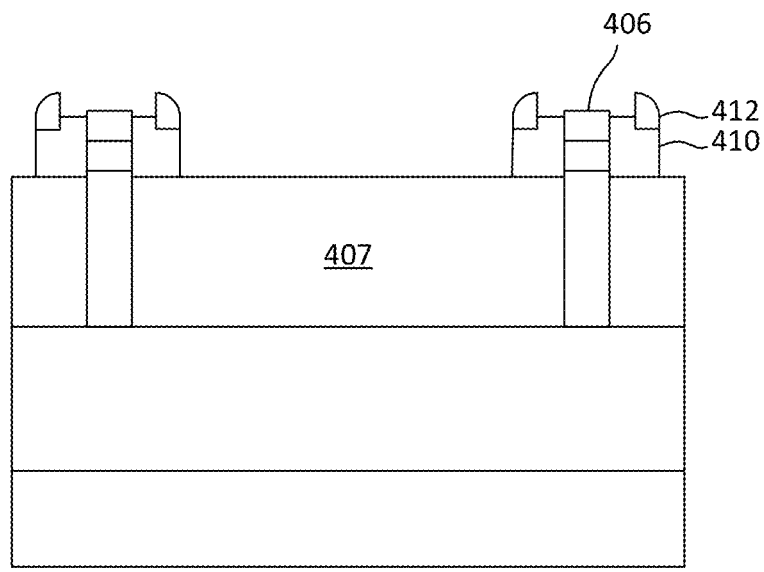

Referring to FIG. 6C, first dielectric layer 410 is further etched back exposing an upper surface of fourth semiconductor layer 407 (block 326). In an embodiment, first dielectric layer 410 may be over-etched by an amount of 50% to expose an upper surface and a portion of sidewalls of hard mask layer 406.

Figure 6D:
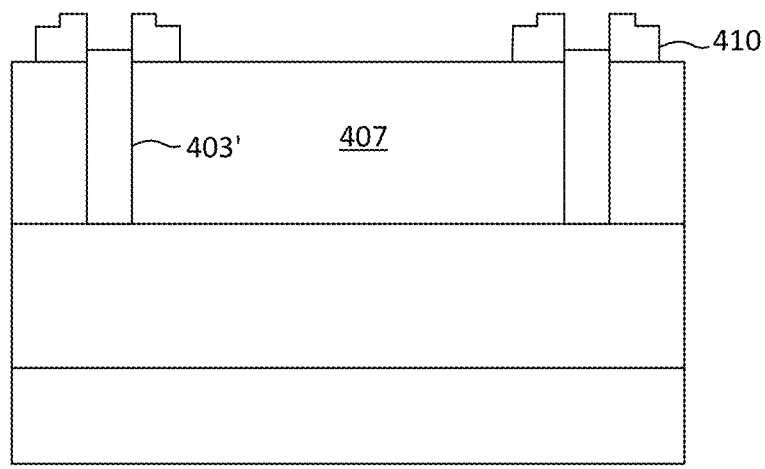

Referring to FIG. 6D, hard mask layer 406 and spacer 412 are removed while retaining the remaining portion of first dielectric layer 410 (block 328).

Figure 7A:
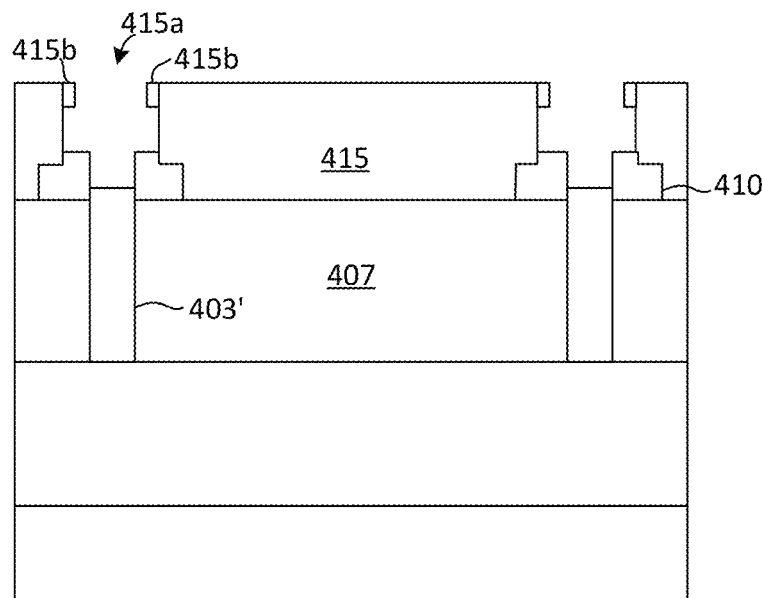
FIG. 7A through FIG. 7H are cross-sectional views showing intermediate stages of a method of fabricating a vertical-fin-based FET device that can be applied to the first and second embodiments of the present disclosure.

FIG. 7A through FIG. 7H are cross-sectional views showing intermediate stages of a method of fabricating a vertical fin-based FET that can be applied to the first and the second embodiment. For illustration purposes, FIG. 7A through 7H show the application to the second embodiment and those skilled in the art can readily apply the same intermediate stages to the first embodiment. Referring to FIG. 7A, a source mask layer 415 is formed overlying the exposed upper surface of fourth semiconductor layer 407 and having an opening 415a exposing a portion of first dielectric layer 410 and an upper surface of fins 403' (block 330). Source mask layer 415 also has an overhang 415b extend over opening 415a. In an embodiment, source mask layer 415 is lift-off capable and has a bottom CD of 0.65 μm and a top CD of 0.55 μm.

Figure 7B:
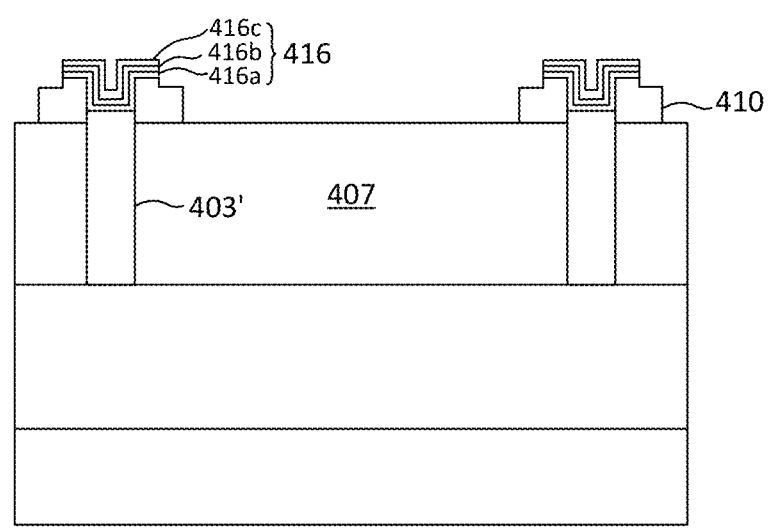

Referring to FIG. 7B, a source metal contact structure 416 is formed by deposition at a temperature of about 150° C. on the exposed upper surface of fins 403' (block 332). In an embodiment, source metal contact structure 416 may include a stack structure comprising a first source metal layer 416a on a metal layer on the upper surface of fins 403', a second source metal layer 416b on first source metal layer 416a, and a third source metal layer 416c on second source metal layer 416b. In an embodiment, first source metal layer 416a includes Ti having a thickness of about 25 nm, second source metal layer 416b includes Al having a thickness of about 100 nm, and third source metal layer 416c includes Mo having a thickness of about 40 nm. In another embodiment, second source metal layer 416b includes TiN and third source metal 416c includes Al. In another embodiment, second source metal layer 416b includes TiN and third source metal 416c is omitted. After forming the source metal contact structure, source mask layer 415 is dissolved to lift off the metal layers deposited thereon, while the metal layers deposited on the upper surface of the fins remain intact. In another embodiment, mask layer 415 is applied in reverse tone after deposition of source metal contact structure 416, and source metal contact structure 416 is etched (e.g., using RIE) except where reverse-tone mask layer 415 is present. Mask layer 415 is then removed. Source metal contact structure 416 formed below opening 415a will have a width of approximately 0.65 μm corresponding to the width of the opening. In an embodiment, a rapid temperature annealing (RTA) treatment may be performed in $N_2$ at 850° C. for 5 minutes. After the RTA treatment, the source metal contact structure will have a specific resistance of less than about $10^{-5}$ ohm-cm$^2$.

In some embodiments, a junction-terminated edge (JTE) structure is formed outside the FET device active area by implantation (e.g., implanting nitrogen (N) or argon (Ar)) to enable stable high-voltage operation of the device.

Figure 7C:
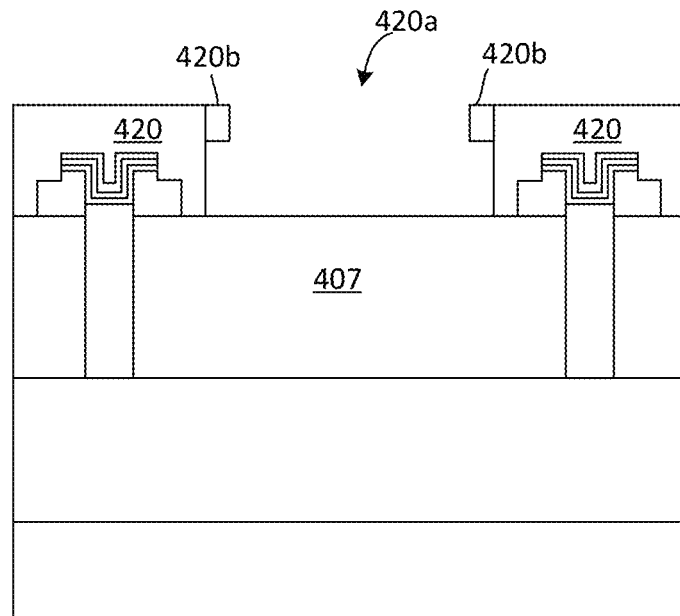

Referring to FIG. 7C, a gate metal mask layer 420 is formed overlying the exposed upper surface of the source metal structure and having an opening 420a exposing a surface portion of fourth semiconductor layer 407 (block 334). Gate metal mask layer 420 also has an overhang 420b extending over opening 420a. In an embodiment, gate metal mask layer 420 is lift-off capable and has a bottom CD of 0.9 μm and a top CD of 0.8 μm.

Figure 7D:
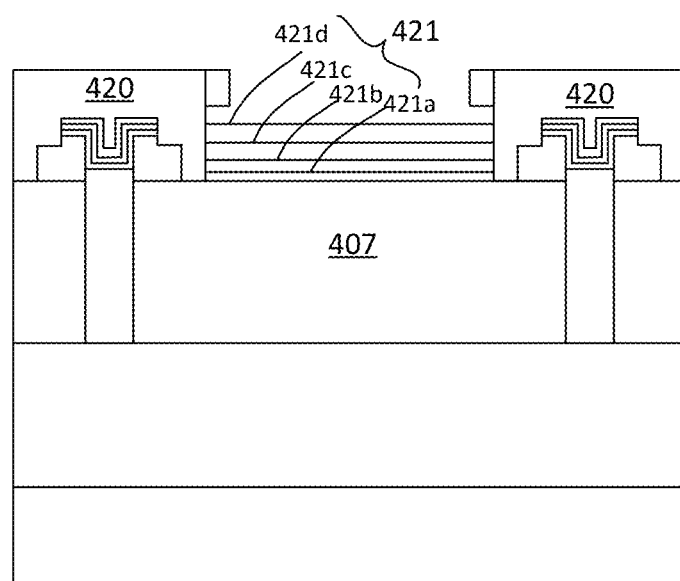

Referring to FIG. 7D, a gate metal contact structure 421 is formed by deposition through opening 420a onto the exposed surface portion of fourth semiconductor layer 407. In an embodiment, gate metal contact structure 421 may include a stack structure comprising a first gate metal layer 421a on the surface portion of fourth semiconductor layer 407, a second gate metal layer 421b on first gate metal layer 421a, a third gate metal layer 421c on second gate metal layer 421b, and a fourth gate metal layer 421d on third gate metal layer 421c. In an embodiment, first gate metal layer 421a includes Ni, second gate metal layer 421b includes Au, third gate metal layer 421c includes Mo, and fourth gate metal layer 421d includes Au. In another embodiment, gate metal layers 421c and 421d are omitted, and first gate metal layer 421a includes Ni and second gate metal layer 421b includes Au. In another embodiment, gate metal layer 421d is omitted, and first gate metal layer 421a includes Pd, second gate metal 421b includes Pt, and third gate metal layer 421c includes Au. After forming the gate metal contact structure, gate mask layer 420 is dissolved to lift off the metal layers deposited on the gate mask layer while the metal layers deposited on the surface portion of fourth semiconductor layer 407 remain intact.

Figure 7E:
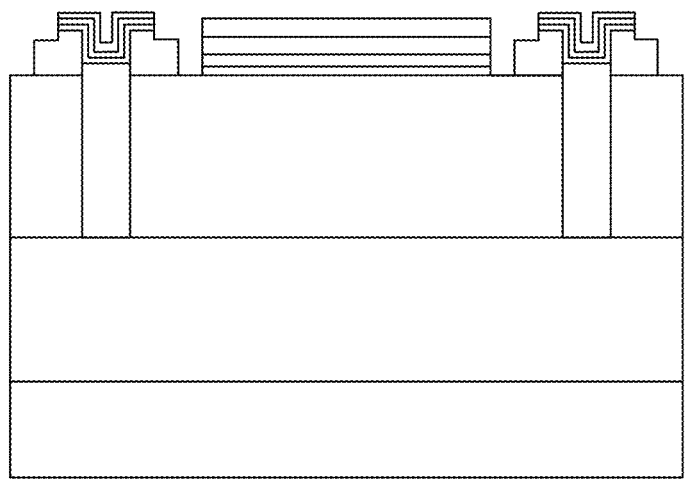

Referring to FIG. 7E, gate metal mask layer 420 is removed (block 334) and a thermal anneal is performed to provide a stable low contact resistance In an embodiment, a rapid thermal annealing (RTA) treatment may be performed in $O_2$ at 500° C. for 10 minutes. After the thermal treatment, the gate metal contact structure will have a specific resistance of less than about $10^{-3}$ ohm-cm$^2$.

Figure 7F:
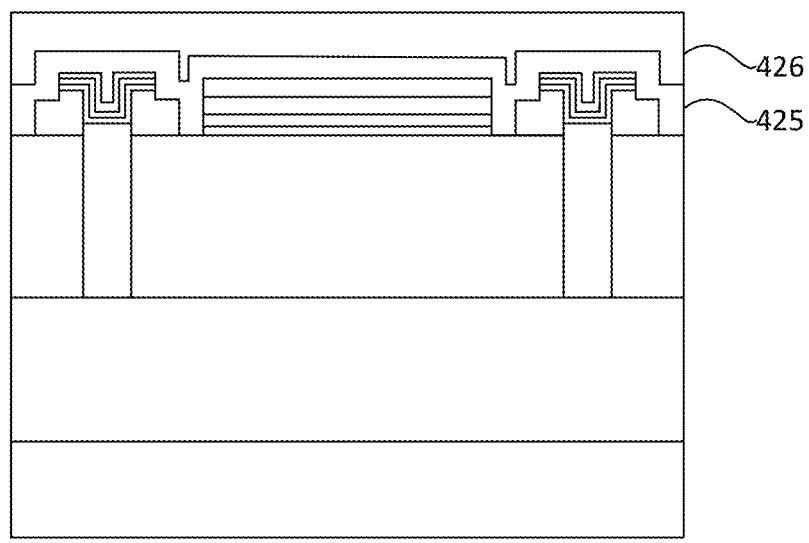

Referring to FIG. 7F, a first interlayer dielectric layer 425 is deposited covering the gate metal contact structure, the source metal contact structure, and the surface of the fourth semiconductor layer, using a plasma enhanced chemical vapor deposition (PECVD) process at a temperature of 300° C. First interlayer dielectric layer 425 is relatively conformal. In an embodiment, layer 425 has a thickness of approximately 50 nm and may include nitride (e.g., silicon nitride). Next, a second interlayer dielectric layer 426 is deposited on first interlayer dielectric layer 425 using a plasma enhanced chemical vapor deposition (PECVD) process at a temperature of 300° C. (block 336). Second interlayer dielectric layer 426 has a thickness of approximately 50 nm and may include oxide (e.g., silicon oxide).

Figure 7G:
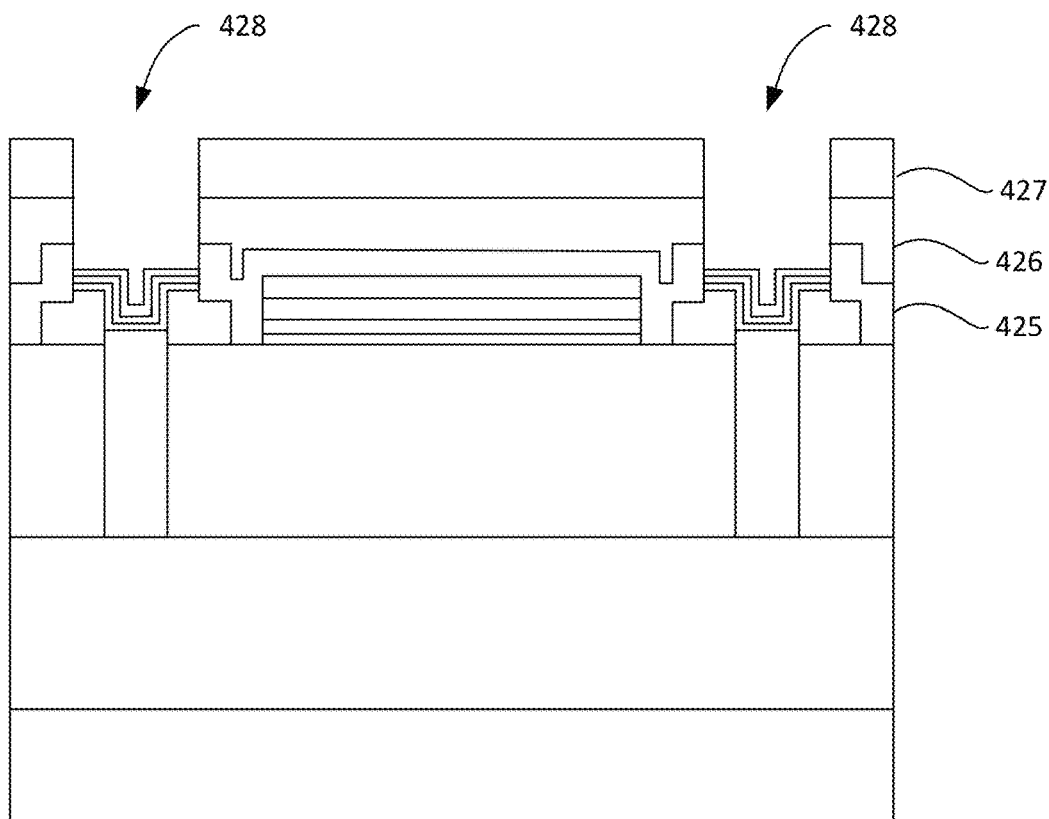

Referring to FIG. 7G, a patterned photoresist layer 427 is formed over second interlayer dielectric layer 426, which can be planarized or un-planarized. Patterned photoresist layer 427 is formed and patterned with well-known photolithography processes to define locations where a via hole 428 is to be formed. Next, first and second interlayer dielectric layers 425, 426 are etched until an upper surface of the source metal contact structure is exposed. In some embodiments, a via hole to the gate metal contact structure may also be formed concurrently with via hole 428 for the source metal contact structure. In an embodiment, the via hole has a CD of approximately 0.45 μm.

Figure 7H:
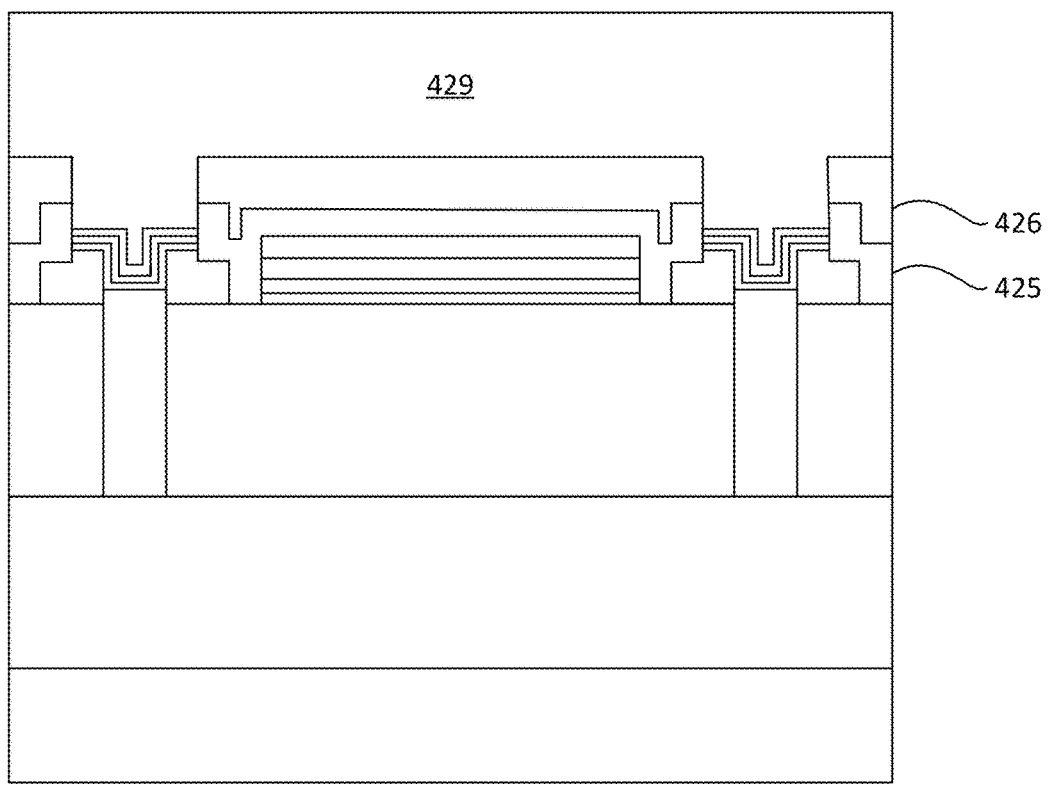

Next, patterned photoresist layer 427 is removed. Referring to FIG. 7H, a conductive material 429 is formed filling via hole 428, and a pad metal deposition is performed on the filled via hole by evaporation to a thickness of about 4 μm (block 336). The above described method of fabricating a vertical fin-based FET is advantageous in that a metal, metal alloy, or metal compound layer (e.g., TiN) is formed on the fin epitaxial layer followed by a hard mask layer.

Figure 8A:
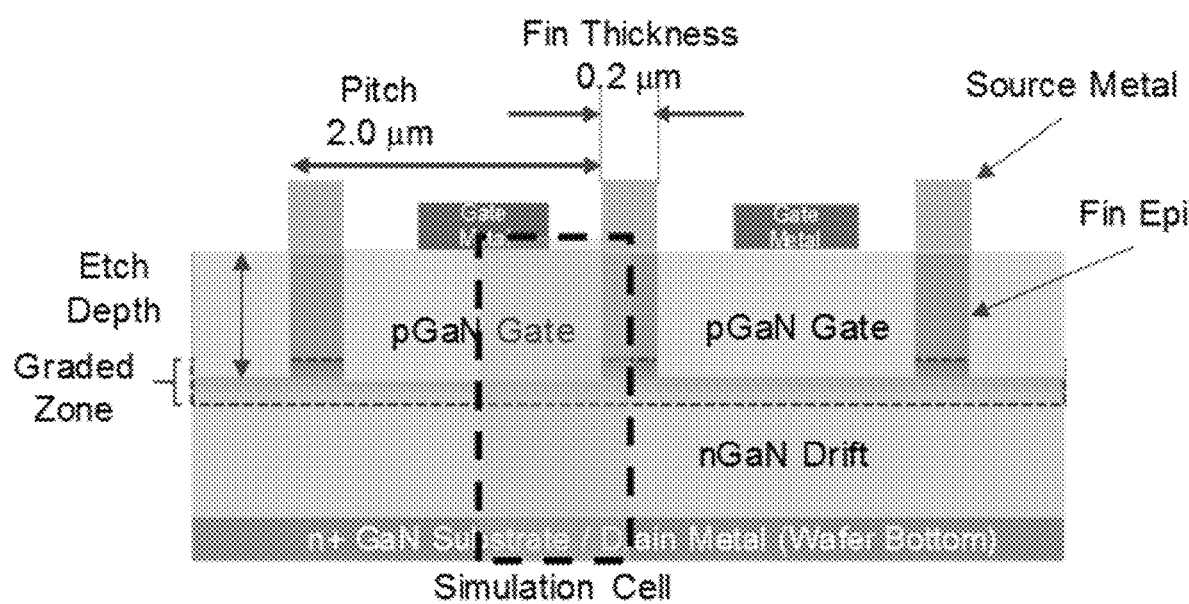
FIG. 8A is a simulation structure of a vertical-fin-based FET device having a 0.2 μm fin thickness.

FIG. 8A is a cross-sectional view of a simulation cell structure using a 0.2 μm fin thickness. The nominal etch depth is 0.1 μm below the bottom of the fin layer (0.1 μm into the graded zone). Etch depth variations of +/−0.1 μm around the nominal were simulated, as well as a graded zone thickness of 0.2 μm for the second round and 0.3 μm for the third round of simulations.

Figure 8B:
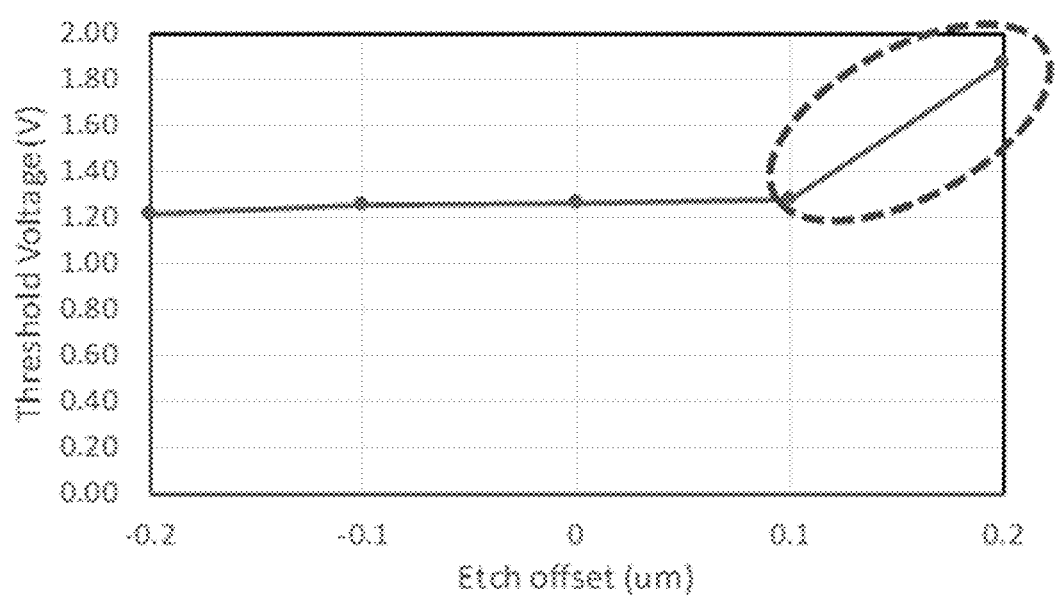
FIG. 8B is a graph illustrating a threshold voltage (in V) of a vertical-fin-based FET device as a function of an etch offset (in μm).
Figure 8C:
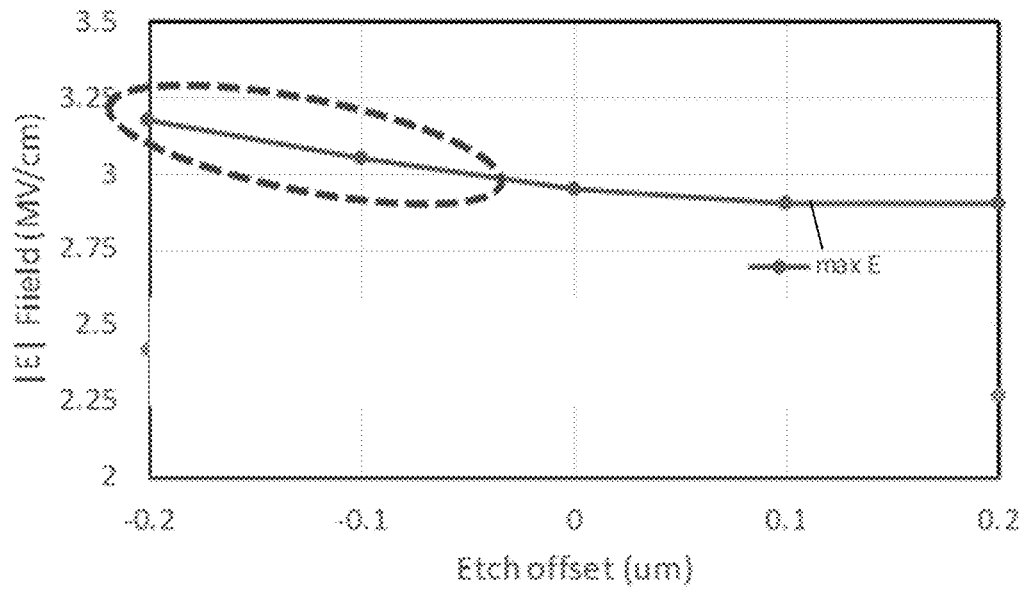
FIG. 8C is a graph illustrating an electric field E (in MV/cm) of a vertical-fin-based FET device as a function of an etch offset (in μm).

FIG. 6 is a graph illustrating a threshold voltage (in V) of a vertical fin-based FET device as a function of an etch offset (in μm) for a 0.3 μm fin and ungraded epitaxial layer. The "0" in the x-axis represents the epitaxial layer between the fin and the drift region. The right side of "0" means an overetch into the drift region below the fin layer, and the left side of "0" means an underetch. The y-axis represents the voltage threshold (V). Referring to FIG. 8C, an overetch into the drift region below the fin layer results in a dramatic increase in the voltage threshold. Referring to FIGS. 8B and 8C, the inventors discovered the acceptable limit for the conductance and the threshold voltage is about 0.1 μm.

FIG. 8C is a graph illustrating an electric field E (in MV/cm) of a vertical fin-based FET device as a function of an etch offset (in μm) for a 0.3 μm fin and ungraded epitaxial layer. The "0" in the x-axis represents the epitaxial layer between the fin and the drift region. The right side of "0" means an overetch into the drift region below the fin layer, and the left side of "0" means an underetch. The y-axis represents the electric field E (MV/cm). An underetch of the epitaxial layer (i.e., above the interface with the drift layer) results in a significant increase of the maximum E field. That is, the breakdown risk increases with an underetch of 0.1 μm or more.

Figure 8D:
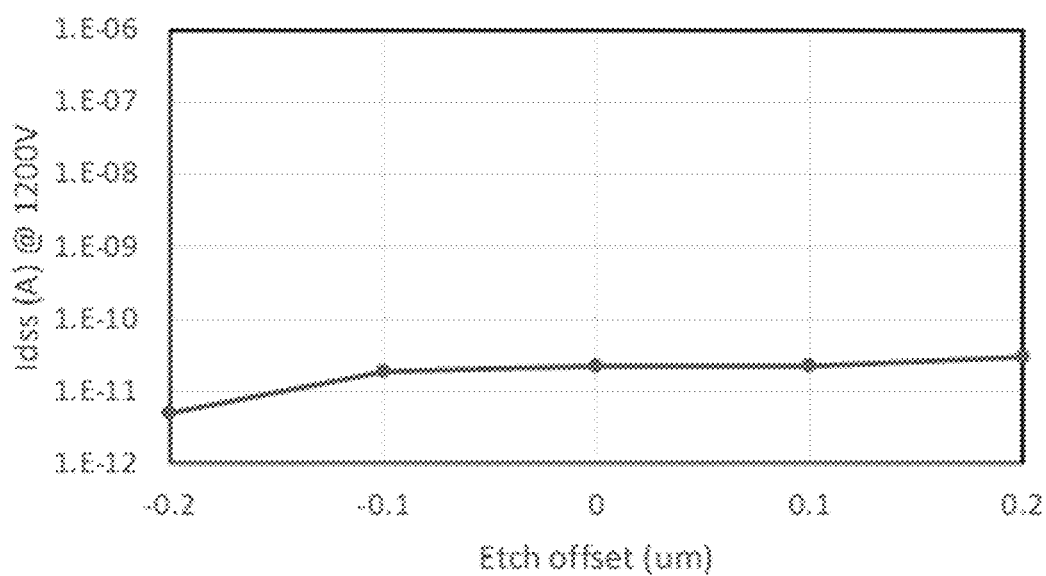
FIG. 8D is a graph illustrating channel leakage (in A) of a vertical-fin-based FET device as a function of an etch offset (in μm).

FIG. 8D is a graph illustrating channel leakage (in A) of a vertical fin-based FET device as a function of an etch offset (in μm) for a 0.3 μm fin and ungraded epitaxial layer. The "0" in the x-axis represents the epitaxial layer between the fin and the drift region. The right side of "0" means an overetch into the drift region below the fin layer, and the left side of "0" means an underetch. The y-axis represents the drain-source leakage current Idss (A). Referring to FIG. 8D, there is no significant impact of the etch variation on the leakage current.

FIGS. 9A through 9C are graphs illustrating a current density (A/cm$^2$) as a function of position relative to the fin for a normal etch for a 0.3 μm fin and ungraded epitaxial layer. The fin is at the right. The solid horizontal line is the nominal etch depth, and the dashed yellow line 1001 shows the fin/drift region interface. The x-axis represents the position of the current density in μm relative to the fin, where "1" is the middle of the fin. The y-axis represents the position of the etched drift region relative to the gate layer, where "0" is the upper surface of the gate layer, and "0.8" is the nominal bottom position of the gate layer. Referring to FIG. 9A, for a nominal etch (also the gate layer bottom), i.e., the etch depth is 0.8 μm at the interface with the drift region, the high current density is around the interface between the gate layer bottom the fin bottom, and the threshold voltage is in a nominal range. FIG. 9B is a graph illustrating a current density for a 0.1 μm overetch. The interface with the gate layer bottom is at 0.9 μm. The threshold voltage is high as indicated by the strip 1002. FIG. 9C is a graph illustrating a current density for a 0.2 μm overetch. The threshold voltage is worse as indicted by the strip 1003. The results are also confirmed in FIG. 6, which shows a significant increase in the threshold voltage at 0.2 μm overetch.

Figures 10A, 10B, 10C:
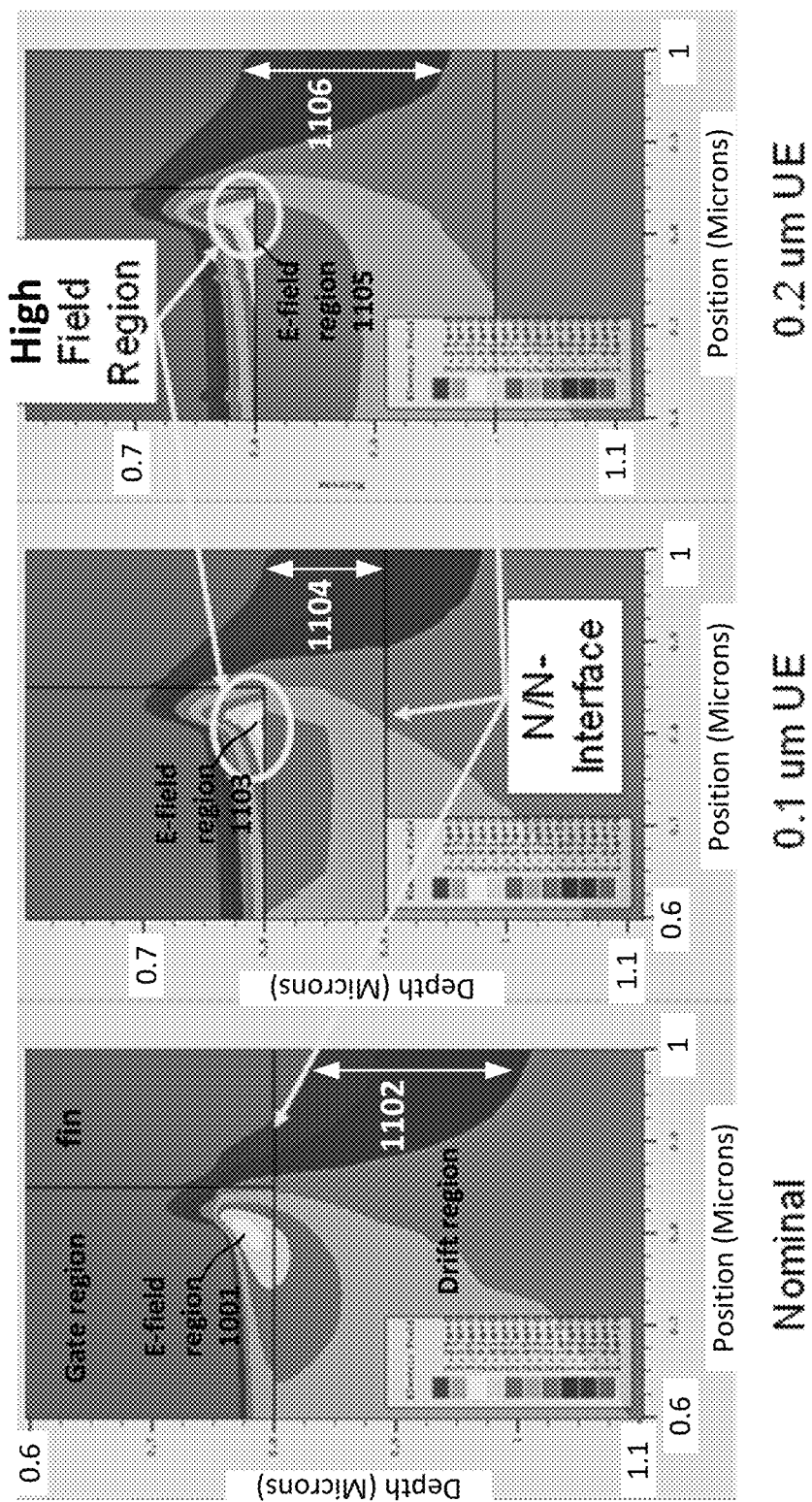
FIG. 10A is a graph illustrating an electric field at the gate corner for a normal etch.
FIG. 10B is a graph illustrating an electric field at the gate corner for a 0.1 μm underetch. FIG. is a graph illustrating a current density for a 0.2 μm underetch. The high-field region (indicated by an ellipse in FIGS. 10B and 10C) are near the gate corner with the fin.

FIGS. 10A through 10C are graphs illustrating an electric field at the gate corner for different etch conditions. The nominal etch condition is indicated by the block denoted "N/N-Interface." FIG. 10A is a graph illustrating the electric field 1101 having a nominal value at the gate corner for a normal etch. The double arrow 1102 shows the heavily doped region below the interface with the gate layer. FIG. 10B is a graph illustrating an electric field 1103 at the gate corner for a 0.1 μm underetch. The double arrow 1104 shows a portion of the heavily doped region (denoted by the double arrow 1104) is disposed between the gate layer and the underetch region, which may cause a high electric filed at the gate corner. FIG. 10C is a graph illustrating ab electric field for a 0.2 μm underetch. The heavily doped region (indicated by the double arrow 1106) is entirely disposed in the underetched region. The results are also shown in FIG. 8D.

0.2 μm Fin with 0.2 μm Graded Epi

Figure 11:
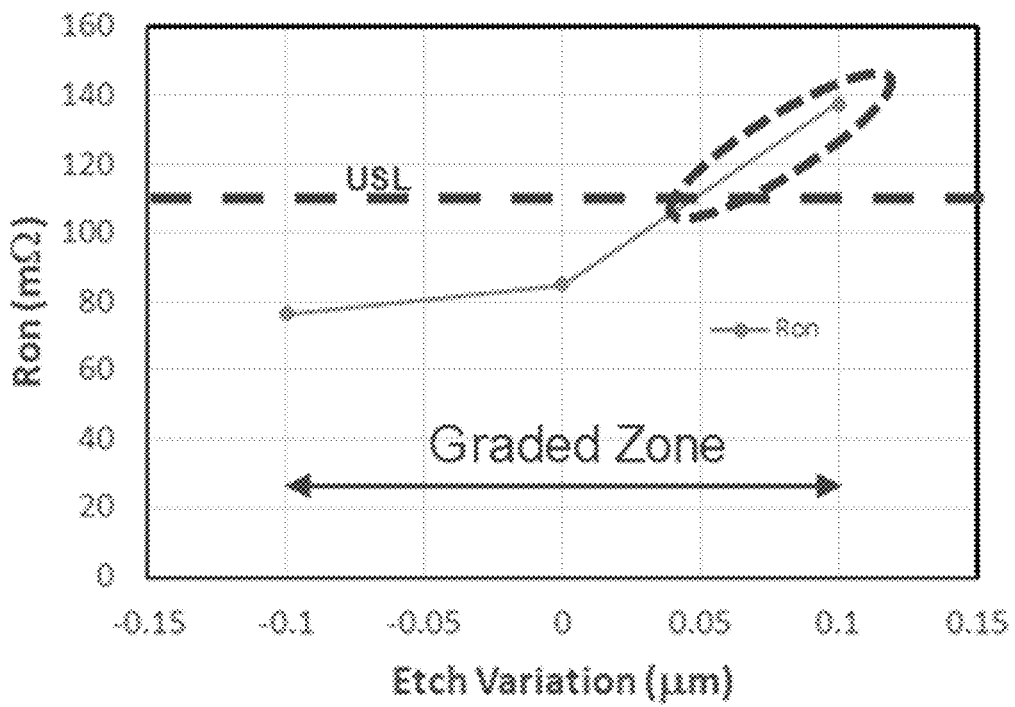
FIG. 11 is a graph illustrating the on-resistance Ron as a function of etch variation (μm) for the 0.2 μm graded epi.

FIG. 11 is a graph illustrating the drain-source on-resistance Ron as a function of etch variation (μm) for the 0.2 μm graded epitaxial layer. "0" is the middle of the 0.2 μm graded epitaxial layer between the fin and the drift regions. Ron increases significantly with 0.1 μm overetch. Referring to FIG. 11, the Ron upper limit "USL" (upper specification limit) is reached at about 0.05 μm overetch. That is, when the etch variation is within the range between +/1 0.1 μm, the on-resistance value will be outside the upper specification limit.

Figure 12:
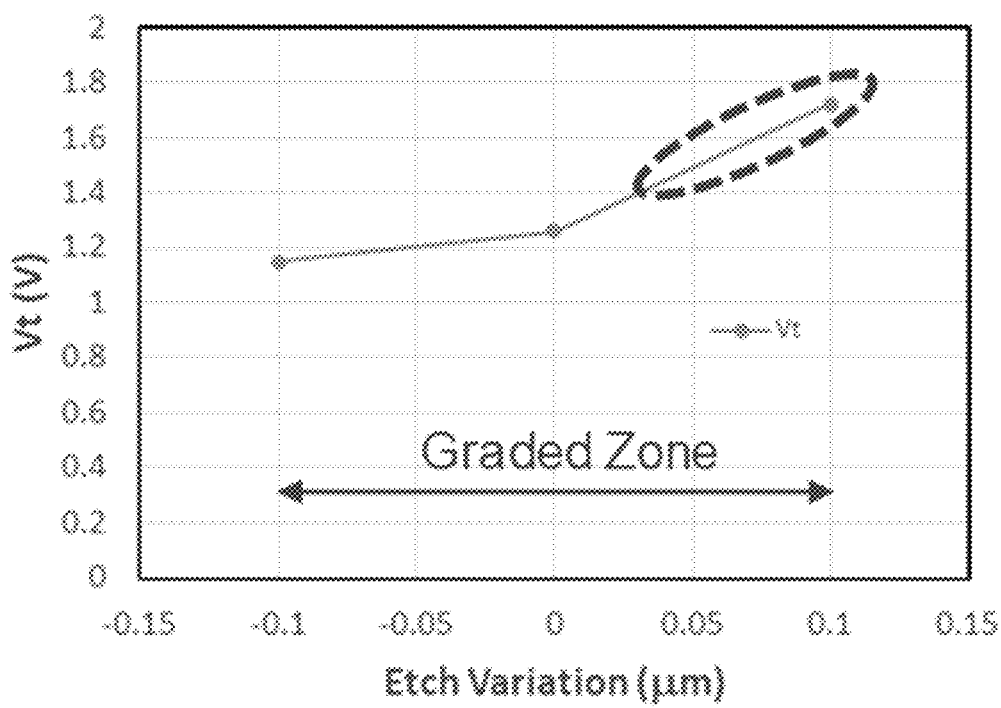
FIG. 12 is a graph illustrating a threshold voltage Vt (V) as a function of etch variation (μm) for the 0.2 μm graded epi.

FIG. 12 is a graph illustrating a threshold voltage Vt (V) as a function of etch variation (μm) for the 0.2 μm graded epitaxial layer. "0" is the middle of the 0.2 μm graded epitaxial layer between the fin and the drift regions. Similar to the Ron, the threshold voltage Vt increases significantly with 0.1 μm overetch. That is, when the graded doping zone is overetched, the threshold value may increase to an unacceptable value. Referring to FIGS. 11 and 12, an underetch does provide an improvement in the on resistance and threshold voltage. The underetch also provides an improvement of the electric field and leakage current, as shown in FIGS. 13 and 14 below.

Figure 13:
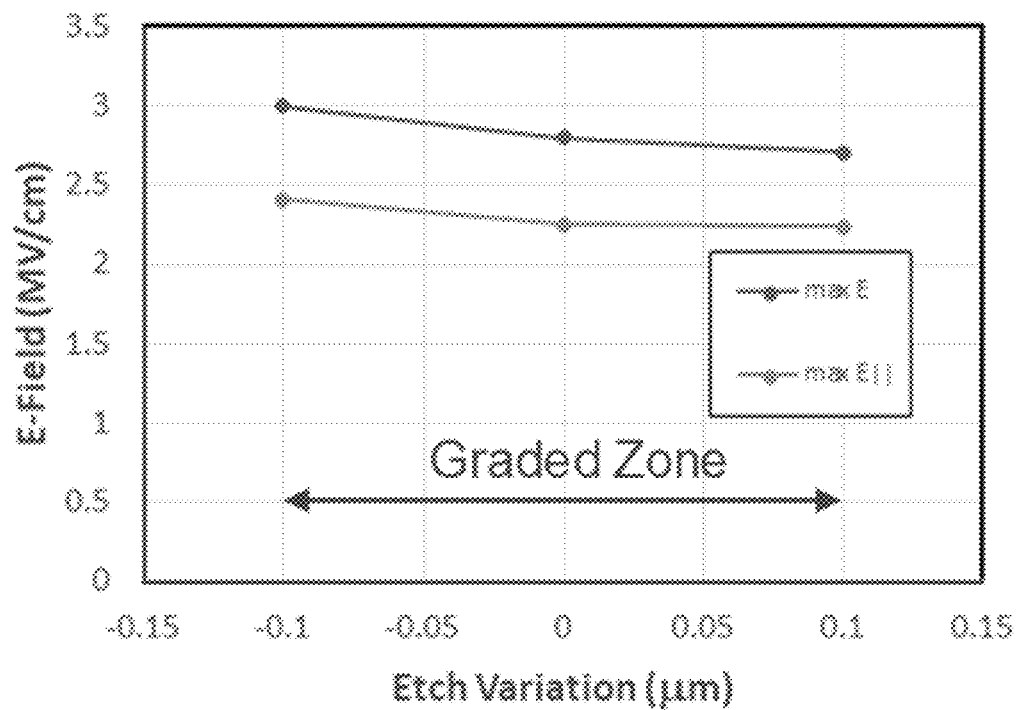
FIG. 13 is a graph illustrating a maximum electric field (MV/cm) as a function of etch variation (μm) for the 0.2 μm graded epi.

FIG. 13 is a graph illustrating a maximum electric field (MV/cm) as a function of etch variation (μm) for the 0.2 μm graded epitaxial layer. The 0.2 μm graded epitaxial layer does provide an improvement in the electric field with underetch, by allowing the nominal etch to end in the graded doping layer. The 0.1 μm underetch case is now similar to the nominal case in the first round of simulations, with a slight increase in the electric field because of the additional charge in the graded doping layer.

Figure 14:
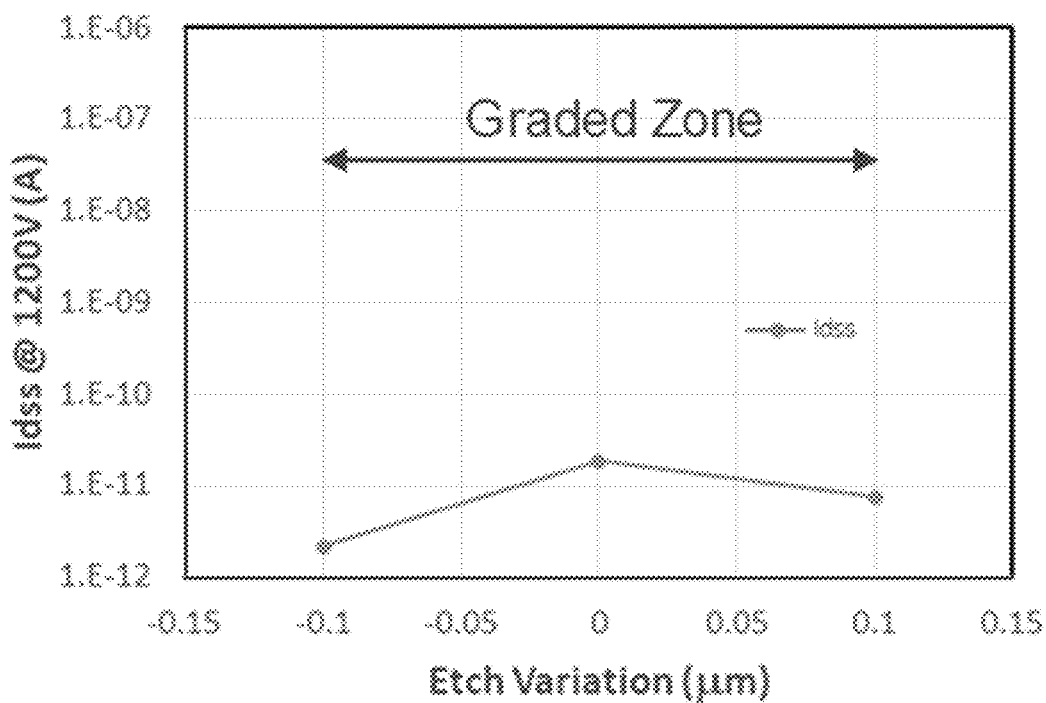
FIG. 14 is a graph illustrating a high-voltage drain leakage current Idss (A) at 1200V as a function of etch variation (μm) for the 0.2 μm graded epi.

FIG. 14 is a graph illustrating a high-voltage drain leakage current Idss (A) at 1200V as a function of etch variation (μm) for the 0.2 μm graded epi. Referring to FIG. 14, the high-voltage drain leakage current Idss remains well controlled with the graded epitaxial layer. That is, an overetch or underetch does not affect the leakage current.

0.2 μm Fin with 0.3 μm Graded Epitaxial Layer

The inventors conducted a third simulation round using the 0.2 μm fin with a 0.3-μm thick linearly graded epitaxial layer inserted between the fin epitaxial layer and the drift region. In the third simulation round, the nominal etch depth was kept at 0.1 μm below the fin epitaxial layer bottom, and the results are shown in FIGS. 16 through 19.

Figure 15:
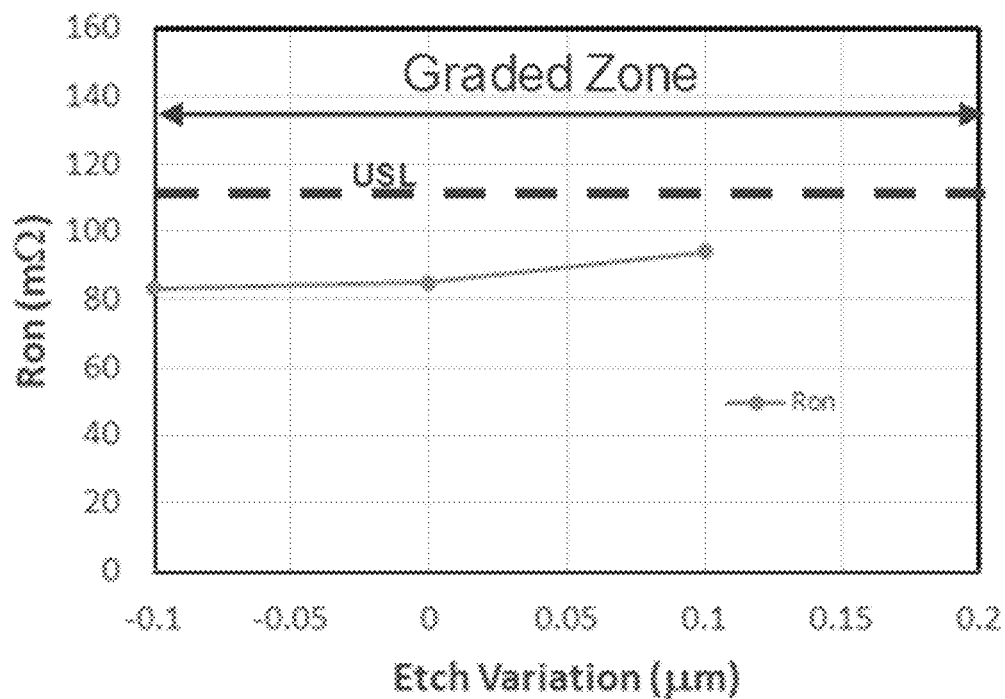
FIG. 15 is a graph illustrating the on-resistance Ron (mΩ) as a function of etch variation (μm) for the 0.3 μm graded epi.

FIG. 15 is a graph illustrating the drain-source on-resistance Ron (mΩ) as a function of etch variation (μm) for the 0.3 μm graded epitaxial layer. Referring to FIG. 15, the on-resistance Ron was well controlled over the +/−1 μm range. Referring to FIG. 15, the on-resistance Ron increases by about 10% with the 0.1 μm overetch, which is acceptable and much less than the 0.2 μm graded epitaxial layer (see FIG. 11) used in the second set of simulations.

Figure 16:
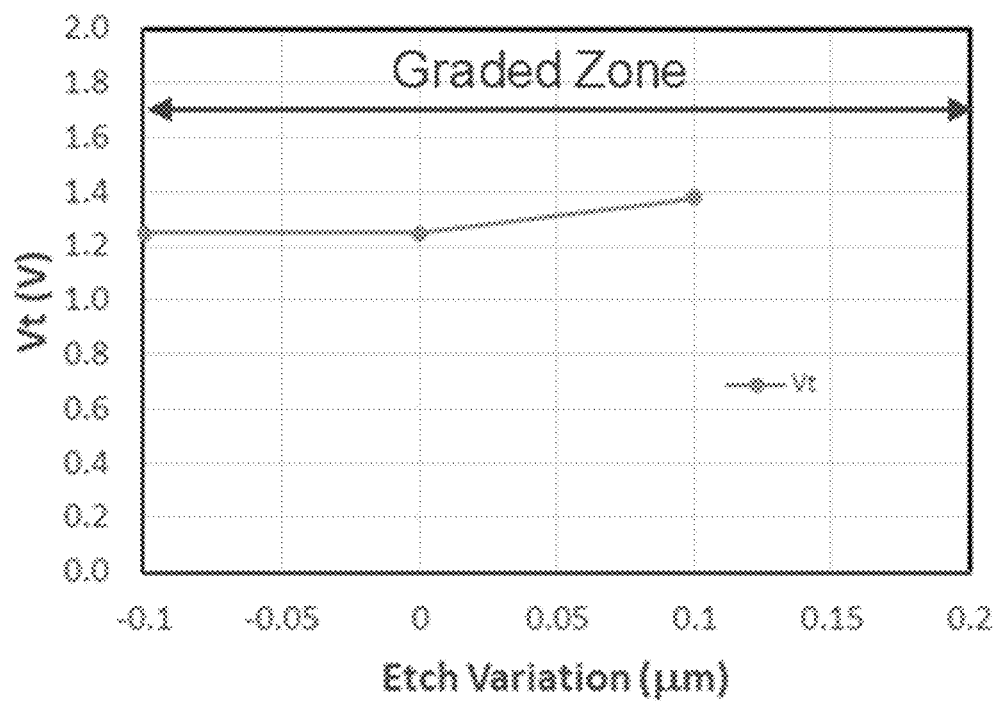
FIG. 16 is a graph illustrating a threshold voltage Vt (V) as a function of etch variation (μm) for the 0.3 μm graded epi.

FIG. 16 is a graph illustrating a threshold voltage Vt (V) as a function of etch variation (μm) for the 0.3 μm graded epi. Referring to FIG. 16, the threshold voltage Vt was well controlled over the +/−1 μm range. The threshold voltage Vt increase by about 10% with the 0.1 μm overetch, which is acceptable and much less than the threshold voltage Vt illustrated in FIG. 12 for the structure utilizing 0.2 μm graded epi used in the second set of simulations.

Figure 17:
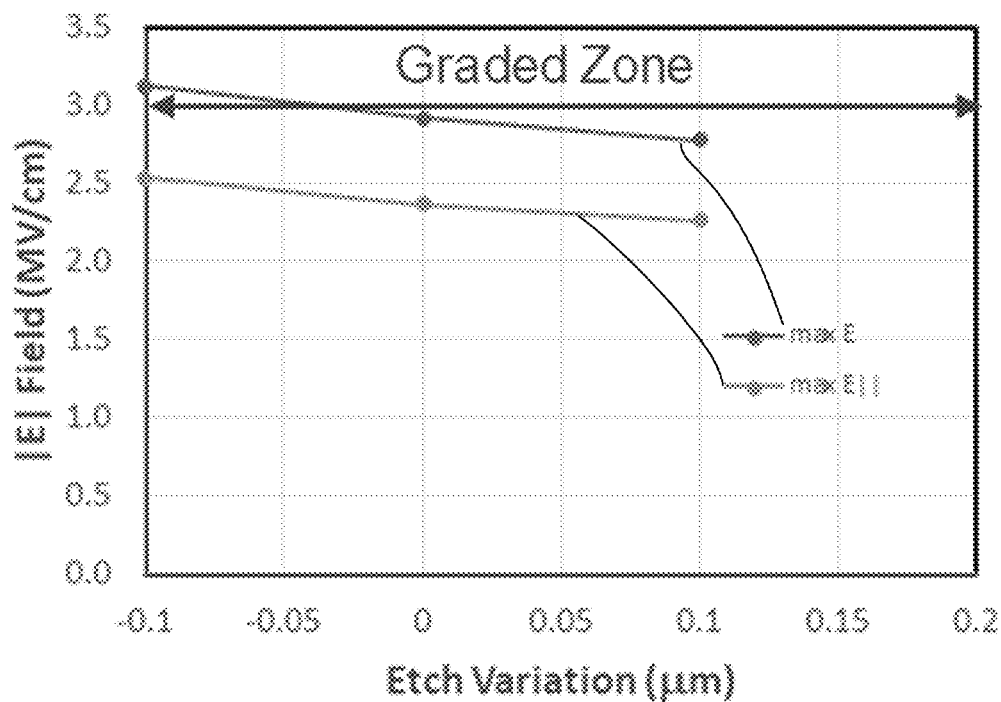
FIG. 17 is a graph illustrating an electric field (MV/cm) as a function of etch variation (μm) for the 0.3 μm graded epi.

FIG. 17 is a graph illustrating an electric field (MV/cm) as a function of etch variation (μm) for the 0.3 μm graded epi. Referring to FIG. 17, the electric field is higher with the 0.3 μm graded region. At the 0.1 μm underetch condition, the electric field is about 3.15 MV/cm (at the borderline), i.e., the maximum electric field is marginal at the minimum etch depth. The borderline or marginal condition will need some additional optimization, either through a change in the grading or re-centering of the nominal etch depth.

Figure 18:
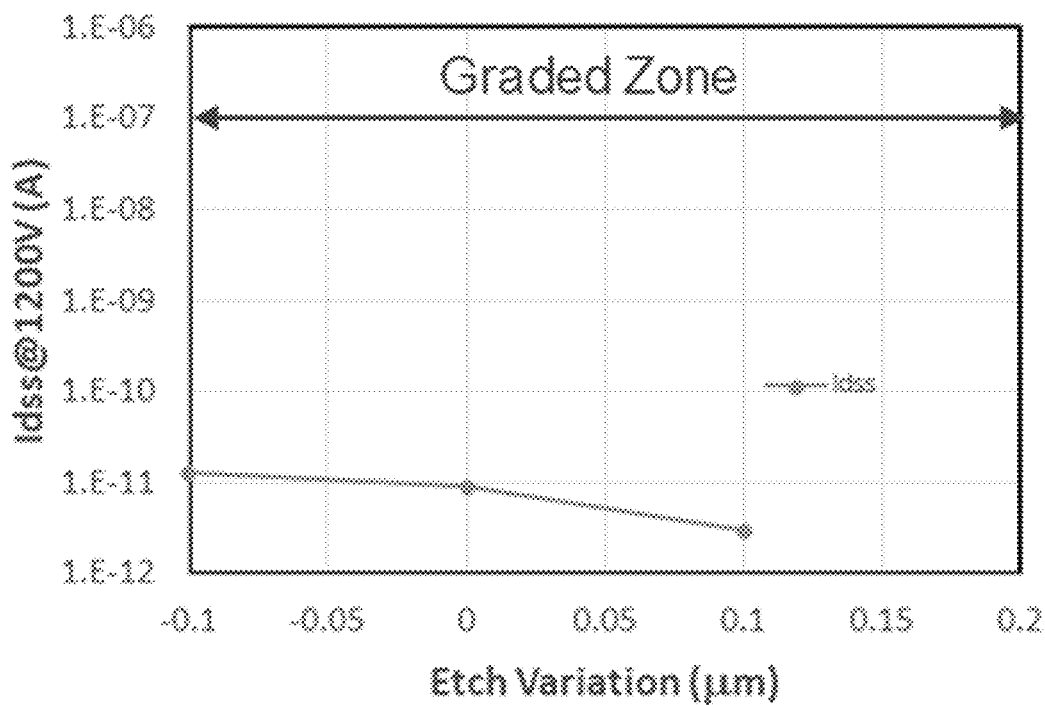
FIG. 18 is a graph illustrating a high-voltage drain leakage current Idss (A) at 1200V as a function of etch variation (μm) for the 0.3 μm graded epi.

FIG. 18 is a graph illustrating a high-voltage drain leakage current Idss (A) at 1200V as a function of etch variation (μm) for the 0.3 μm graded epi. Referring to FIG. 18, the high-voltage drain leakage current Idss was well controlled over the simulated etch range.

In summary, the inventors have determined that using an abrupt fin-epitaxial layer to drift region doping transition, the expected fin-etch depth process variation will cause unacceptable variations in the drain-source on-resistance Ron, and the threshold voltage Vt and breakdown voltage. Inserting a graded-doping zone as a transition layer between the fin-epitaxial region and the drift region significantly improves the parameter variation with etch process variation. A linearly-graded 0.3 μm transition zone achieves good control over the drain-source on-resistance Ron and Vt variations. The electric field is high, and the grading (or etch depth) is optimized by embodiments of the present invention to reduce the electric field levels to about 3 MV/cm.

In one embodiment, an existing Silvaco TCAD model for the FET device was modified to use $In_{0.15}Ga_{0.85}N$ material in the gate region. Expected polarization charge at the $In_{0.15}Ga_{0.85}N$/GaN interface was calculated using material models and a strain calculation.

Table 1 shows calculated charge components for the $In_{0.15}Ga_{0.85}N$/GaN interface.

TABLE 1

| $In_{0.15}Ga_{0.85}N$/GaN | |
|---|---|
| Spontaneous, $P_{sp}$ | 2.197e13 cm$^{-2}$ |
| Piezoelectric, $P_{pz}$ | −1.117e13 cm$^{-2}$ |
| Net, $P_{total}$ | 1.08e13 cm$^{-2}$ |

It is assumed that this polarization charge occurs on the c-plane, but not on the channel sidewall (m-plane), following the typical behavior of III-N heterointerfaces on these planes.

Figures 19A, 19B:
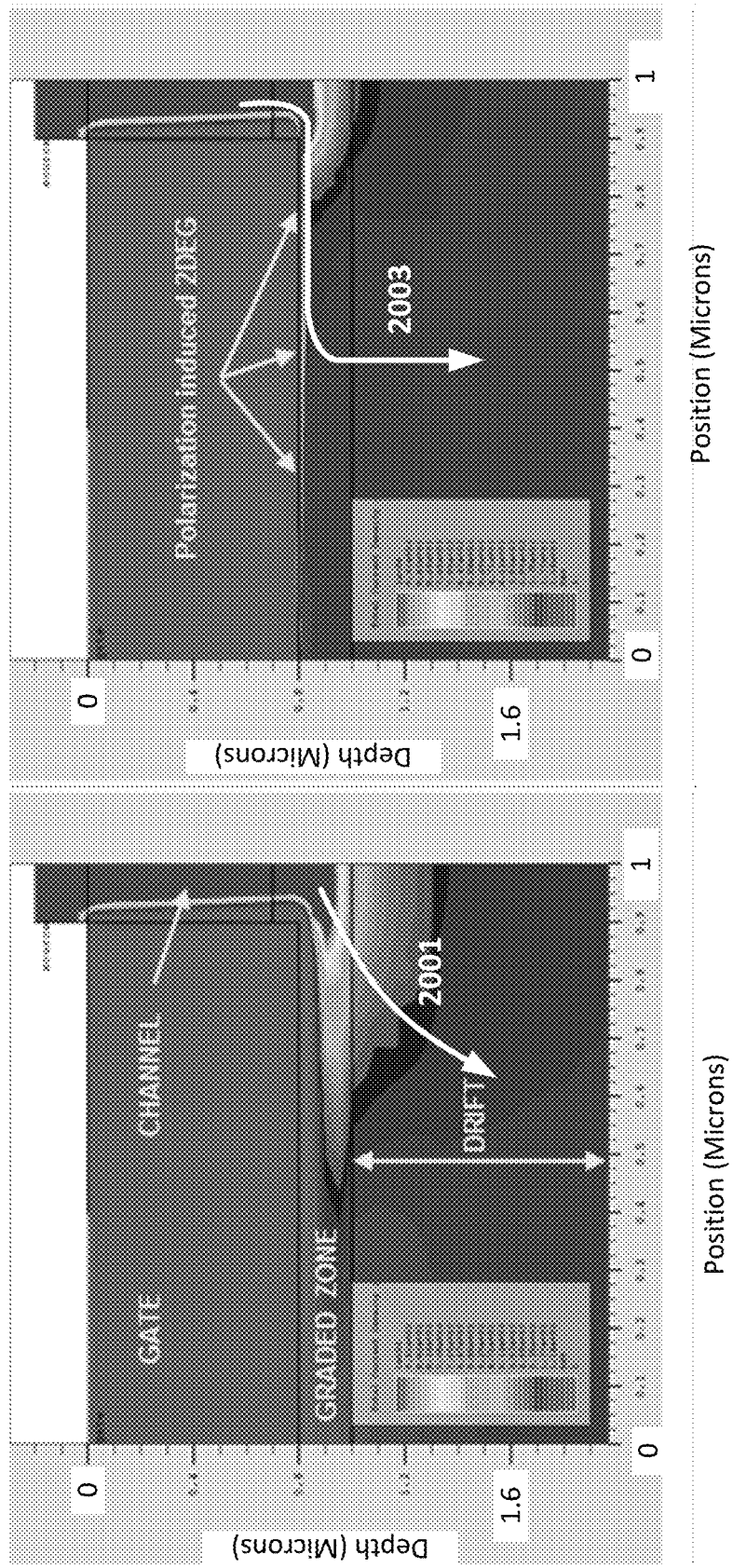
FIG. 19A is a graph illustrating an effect of no polarization charge on the current density predicted to result at the c-plane $In_{0.15}Ga_{0.85}N$/GaN interface.
FIG. 19B is a graph illustrating an effect of the polarization charge predicted to result at the c-plane $In_{0.15}Ga_{0.85}N$/GaN interface according to some embodiments of the present disclosure.

FIG. 19A is a graph illustrating an effect of no polarization charge on the current density predicted to result at the c-plane $In_{0.15}Ga_{0.85}N$/GaN interface. The graph shows a 2D cross section of total current density for the case where polarization is not included. Referring to FIG. 19A, a current 2001 flows from the channel region between the fin and the gate region toward the drift region without sufficiently spreading horizontally through the interface between the $In_{0.15}Ga_{0.85}N$ gate region and the GaN drift region. FIG. 19B is a graph illustrating an effect of the polarization charge predicted to result at the c-plane $In_{0.15}Ga_{0.85}N$/GaN interface according to some embodiments of the present disclosure. The graph shows a 2D cross section of total current density for the case where polarization is included. The net positive fixed charge at the interface due to polarization is expected to attract equal and opposite mobile charge (2D electron gas). The 2DEG at this location results in greater current spreading at the channel opening to the drift layer. Referring to FIG. 19B, the current 2003 flows horizontally along a lateral surface of the bottom portion of the gate layer via a two-dimensional electron gas (2DEG), which is induced by polarization of the $In_{0.15}Ga_{0.85}N$/GaN interface in the c-plane, then vertically in a direction toward the substrate and the drain metal contact through the drift region. This can provide significant advantages of smaller device sizes and lower costs over existing devices that do not include polarization.

Figures 20A, 20B:
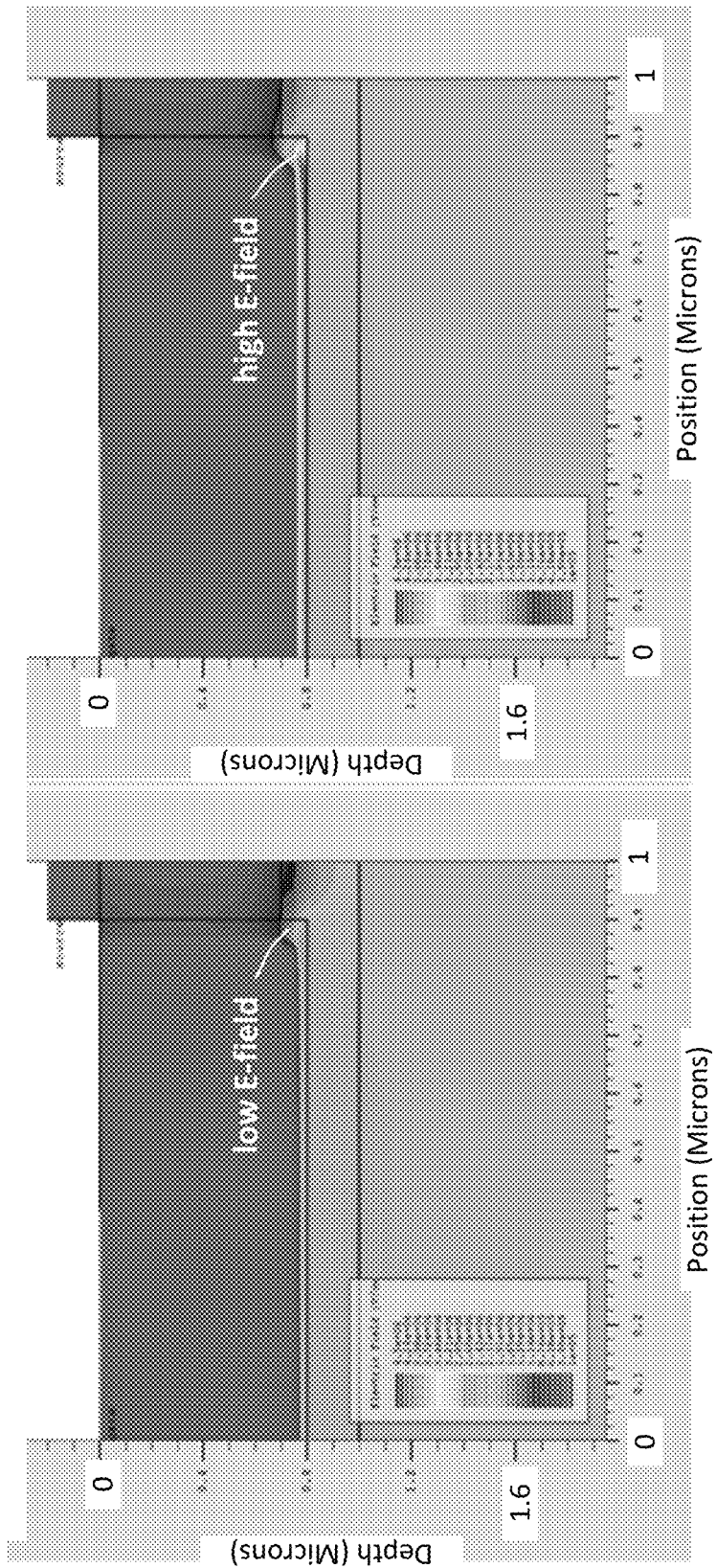
FIG. 20A is a graph illustrating an effect of an electric field predicted to result at the interface between the c-plane $In_{0.15}Ga_{0.85}N$ gate layer and the GaN drift layer.
FIG. 20B is a graph illustrating an effect of an electric field predicted to result at the c-plane $In_{0.15}Ga_{0.85}N$/GaN interface according to some embodiments of the present disclosure. The graph shows a relatively high electric field is formed due to the polarization in an off state.

FIG. 20A is a graph illustrating an effect of an electric field predicted to result at the interface between the c-plane $In_{0.15}Ga_{0.85}N$ gate layer and the GaN drift layer. A relatively low electric field is formed uniformly between the gate layer (region) and the drift layer (region) in an off state. FIG. 20B is a graph illustrating an effect of an electric field predicted to result at the c-plane $In_{0.15}Ga_{0.85}N$/GaN interface according to some embodiments of the present disclosure. The graph shows a relatively high electric field is formed due to the polarization in an off state.

Figure 20C:
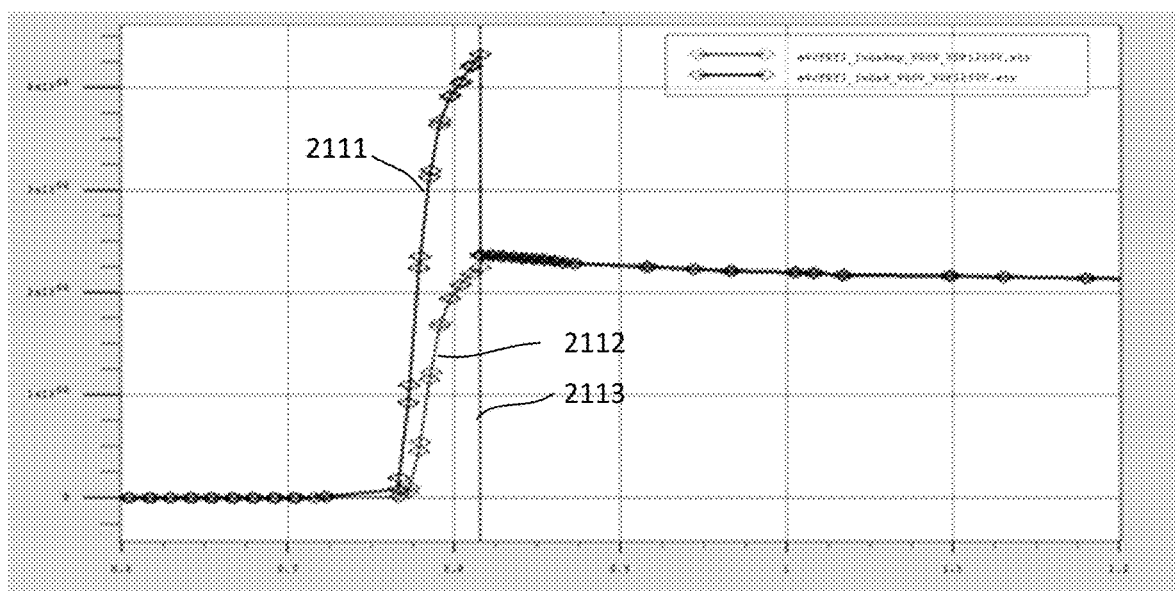
FIG. 20C is a graph illustrating the off-state magnitude of electric field without polarization and with polarization.

FIG. 20C is a graph illustrating the off-state magnitude of electric field without polarization 2111 and with polarization 2112. Referring to FIG. 20C, a vertical cutline 2113 through the non-channel (pn-junction region) is illustrated. The presence of the 2DEG due to polarization results in high electric field at the interface in the off-state.

Table 2 illustrates simulated electrical parameters of a baseline GaN FinFET vs. an $In_{0.15}Ga_{0.85}N$ gate FinFET which includes polarization.

TABLE 2

|  | Baseline FinFET | InGaN FinFET with polar |
|---|---|---|
| Ichannel | 0.8 | 0.8 |
| Nchannel | 1.30E+17 | 1.30E+17 |
| Graded landing | yes | yes |
| Fin width (μm) | 0.2 | 0.2 |
| Vth (V) | 1.23 | 1.15 |
| IDSS@1200 V (A) | 8.70E−12 | 7.10E−12 |
| Max E (MV/cm) | 2.92 | 4.5 |
| Max E ∥ (MV/cm) | 2.4 | 2.4 |
| Conductance/unit trench (S/cm) | 6.55E−08 | 6.60E−0.8 |

As has been demonstrated in FIG. 19A, FIG. 19B, FIGS. 20A through 20C, and Table 2 above, the use of 15% InGaN is shown to be capable of providing the benefits expected (lower threshold voltage Vth 1.15 V vs. 1.23V), but with a tradeoff of increased E-field (4.5 MV/cm vs. 2.92 MV/cm) in the off-state. It suggests using a lower percentage In, which results in lower polarization charge, or even negligible polarization. Accordingly, simulation results for a non-polar InGaN FINFET structure are shown below.

Table 3 illustrates simulated electrical parameters of a baseline GaN FinFET vs. a non-polar InGaN gate FinFET.

TABLE 3

|  | Baseline FinFET | InGaN FinFET non-polar |
|---|---|---|
| Ichannel | 0.8 | 0.8 |
| Nchannel | 1.30E+17 | 1.30E+17 |
| Graded landing | yes | yes |
| Fin width (μm) | 0.2 | 0.2 |
| Vth (V) | 1.23 | 1.15 |
| IDSS@1200 V (A) | 8.70E−12 | 7.10E−12 |
| Max E (MV/cm) | 2.92 | 2.6 |
| Max E ∥ (MV/cm) | 2.4 | 2.4 |
| Conductance/unit trench (S/cm) | 6.55E−08 | 6.60E−0.8 |

Referring to Table 3, the use of InGaN results in a −0.08V threshold voltage shift (1.15V vs. 1.23V) with a low electric field (2.6 MV/cm vs. 2.92 MV/cm). The channel doping can be re-tuned to return to the baseline threshold voltage, resulting in very little electrical difference between the structures. The advantage for InGaN will be lower temperature growth and better ohmic contact and p-type doping.

Figures 21A, 21B:
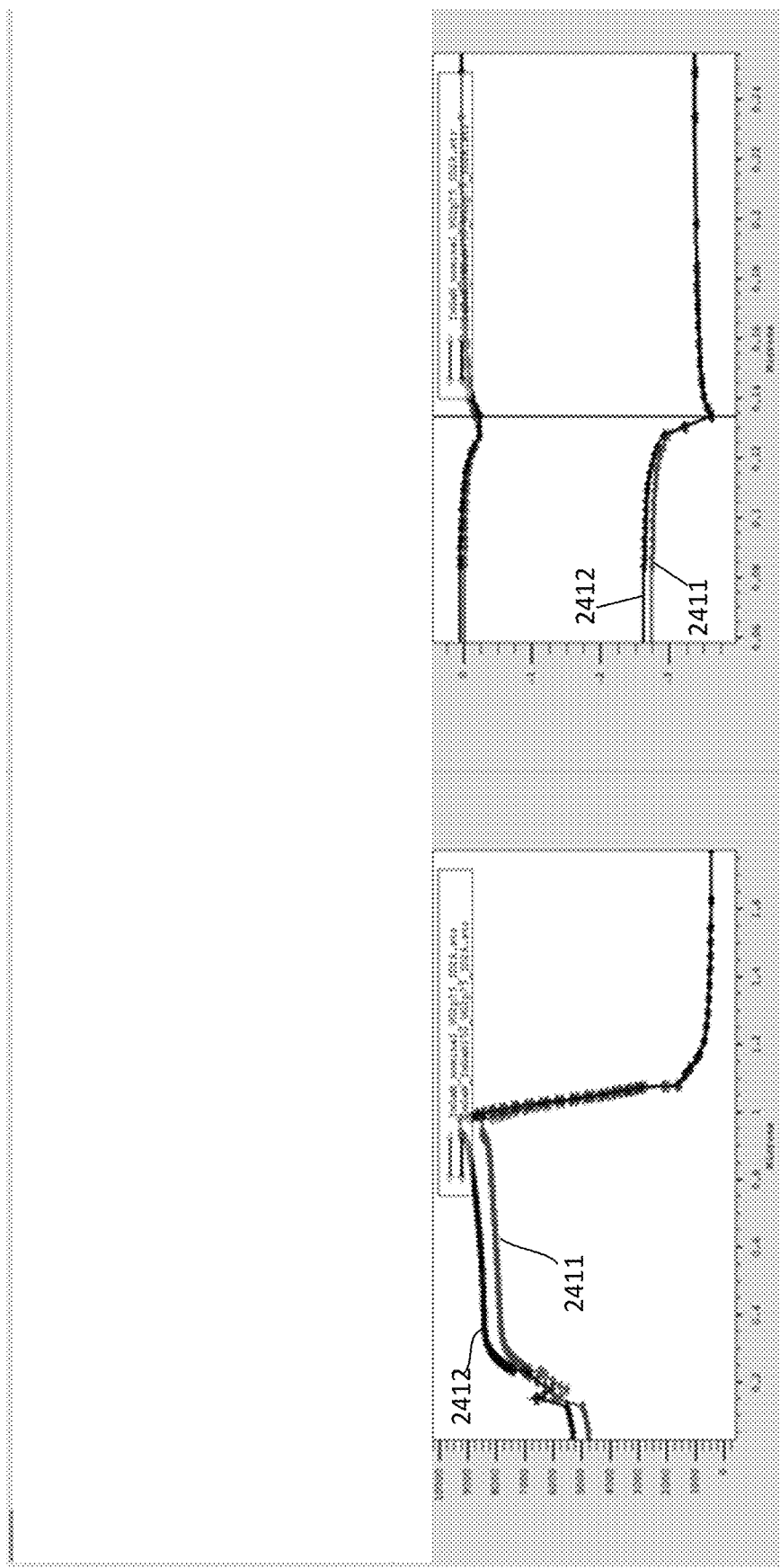
FIG. 21A and FIG. 21B are graphs illustrating a current density through the channel of a baseline FET compared with that of a non-polar FET at 150 degrees C.

FIG. 21A and FIG. 21B are graphs illustrating the current density through the channel of the FET (FIG. 21A) and the associated band diagram of the gate and drift region adjacent to the channel of the FET (FIG. 21B). In both figures, a baseline FET (curve 2411) characteristic is compared with that of a non-polar FET (curve 2412) at 150 degrees C. In FIG. 21A, a vertical cutline of current density through the channel is shown, and FIG. 21B shows the band diagram for a vertical section under the gate into the drift region in a non-channel region adjacent to the FET channel.

According to embodiments of the present invention, Fin-FETS with p-type gate regions utilizing InGaN (e.g., in place of GaN) are provided. The utilization of InGaN for the p-type gate material provides a number of benefits not available using conventional techniques. For example, some process flows described herein utilize the lower growth temperature of InGaN compared to GaN, which serves to protect the regrowth hard mask utilized during the regrowth process. Moreover, some embodiments utilize magnesium doping in which the Mg dopant is shallower in the InGaN layer, resulting in a higher ionization of the dopant at the same temperature. In addition, the lower bandgap of InGaN assists in the formation of ohmic contacts to the p-type region.

Embodiments of the present invention consider the effect of polarization to achieve a desired trade-off between current spreading and high electric field, which has been demonstrated.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A transistor comprising:
a substrate having a first surface and a second surface opposite the first surface;
a drift region having a doped region disposed on the first surface of the substrate and a graded doping region disposed on the doped region;
a semiconductor fin comprising a lower portion and an upper portion, wherein the lower portion protrudes from the graded doping region and contains a portion of the graded doping region and the upper portion defines a fin sidewall, and wherein a metal compound layer is disposed in the upper portion of the semiconductor fin and defines a lower contact portion, a contact sidewall, and a contact top side, and wherein the contact sidewall is aligned to the fin sidewall;
a source metal contact on the contact top side of the metal compound layer and defining an upper contact portion;
a gate layer having a bottom portion directly contacting the graded doping region and the fin sidewall;
a gate metal contact disposed on the gate layer and defining a gate metal contact sidewall and a gate metal contact top side, wherein the gate metal contact top side is above the contact top side in a cross-sectional view; and
a drain metal contact disposed on the second surface of the substrate.

2. The transistor of claim 1, wherein:
the upper portion of the semiconductor fin defines an additional fin sidewall opposing the fin sidewall;
the metal compound layer defines an additional contact sidewall opposing the contact sidewall; and
a first separation between the fin sidewall and the additional fin sidewall is equal to a second separation between the contact sidewall and the additional contact sidewall.

3. The transistor of claim 2, wherein the fin sidewall is parallel to the additional fin sidewall and both the fin sidewall and the additional fin sidewall are substantially perpendicular to the substrate.

4. The transistor of claim 1, wherein the upper contact portion of the source metal contact overlaps with a region of the gate layer.

5. The transistor of claim 1, further comprising:
a first dielectric over the first surface of the substrate and contacting the contact sidewall; and
an interlayer dielectric interposed between the gate metal contact sidewall and the first dielectric.

6. The transistor of claim 1, wherein:
the semiconductor fin comprises a first dopant concentration;
the doped region of the drift region having a second dopant concentration that is lower than the first dopant concentration; and
the graded doping region of the drift region having a third dopant concentration linearly increasing from the second dopant concentration to the first dopant concentration.

7. The transistor of claim 1, wherein:
the substrate comprises an N+ GaN layer;
the doped region of the drift region comprises an N-GaN layer;
the semiconductor fin comprises an N GaN layer; and
the gate layer comprises an $In_xGa_{1-x}N$ layer, where $0<x<1$.

8. The transistor of claim 1, further comprising a polar c-plane interface between the gate layer and the graded doping region.

9. The transistor of claim 1, wherein:
the metal compound layer comprises TiN; and
the source metal contact comprises a Ti/Al/Mo stack structure, wherein Al is deposited on Ti and Mo is deposited on Al.

10. The transistor of claim 1, wherein the drift region has a thickness of about 12 µm, the graded doping region has a thickness of about 0.3 µm, and the semiconductor fin has a thickness of about 0.7 µm and a width of about 0.2 µm.

11. The transistor of claim 1, wherein the gate metal contact comprises a Ni/Au/Mo stack structure, wherein Au is deposited on Ni and Mo is deposited on Au.

12. The transistor of claim 1, wherein the lower portion of the semiconductor fin comprises a first lower sidewall and a second lower sidewall opposing but not parallel to the first lower sidewall.

13. The transistor of claim 12, wherein the first lower sidewall forms an angle other than 90 degrees with the substrate.

14. A transistor comprising:
a substrate having a first surface and a second surface opposite the first surface;
a drift region having a doped region on the first surface of the substrate and a graded doping region on the doped region;
a semiconductor fin comprising a lower portion, an upper portion, and a metal compound layer on the upper portion, wherein the lower portion protrudes from the graded doping region and contains a portion of the graded doping region and the upper portion is characterized by a first fin sidewall and a second fin sidewall opposing the first fin sidewall, and wherein the metal compound layer is characterized by a contact top side, a first contact sidewall, and a second contact sidewall opposing the first contact sidewall, wherein the first contact sidewall and the first fin sidewall are coplanar and the second contact sidewall and the second fin sidewall are coplanar;

a source metal contact in electrical contact with the metal compound layer;

a gate layer having a bottom portion directly contacting the graded doping region;

a gate metal contact disposed on the gate layer and defining a gate metal contact sidewall and a gate metal contact top side, wherein the gate metal contact top side is above the contact top side in a cross-sectional view; and a drain metal contact on the second surface of the substrate.

15. The transistor of claim 14, further comprising:

a first dielectric over the first surface of the substrate and contacting the first contact sidewall and the second contact sidewall; and a first interlayer dielectric interposed between the gate metal contact sidewall and the first dielectric.

16. The transistor of claim 15, further comprising:

a second interlayer dielectric over the first interlayer dielectric;

a first via contact extending through the first interlayer dielectric and the second interlayer dielectric and coupled to the source metal contact; and a second via contact extending through the first interlayer dielectric and the second interlayer dielectric and coupled to the gate metal contact.

17. The transistor of claim 16, wherein the first dielectric further contacts:

the first fin sidewall; and the second fin sidewall.

18. The transistor of claim 16, wherein:

the second interlayer dielectric comprises an interlayer dielectric top side;

the first via contact comprises a first via contact top side;

the second via contact comprises a second via contact top side; and the interlayer dielectric top side, the first via contact top side, and the second via contact top side are coplanar.

19. The transistor of claim 14, wherein the source metal contact comprises an upper contact portion that overlaps with a region of the gate layer.

20. The transistor of claim 14, wherein:

the graded doping region comprises a first thickness between the semiconductor fin and the drift region and a second thickness between the gate layer and the drift region;

the first thickness is about 0.3 microns; and the second thickness is less than the first thickness.

* * * * *